(12) United States Patent
Taniguchi

(10) Patent No.: US 6,278,294 B1
(45) Date of Patent: *Aug. 21, 2001

(54) OUTPUT BUFFER CIRCUIT

(75) Inventor: Hideki Taniguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/403,199

(22) PCT Filed: May 1, 1997

(86) PCT No.: PCT/JP97/01506

§ 371 Date: Oct. 15, 1999

§ 102(e) Date: Oct. 15, 1999

(87) PCT Pub. No.: WO98/51012

PCT Pub. Date: Nov. 12, 1998

(51) Int. Cl.[7] .................. H03K 19/0175; H03K 17/16
(52) U.S. Cl. ................... 326/80; 326/57; 327/387
(58) Field of Search .................. 326/80, 81, 57, 326/58, 83; 327/387, 391, 333

(56) References Cited

U.S. PATENT DOCUMENTS

| 4,506,164 | 3/1985 | Higuchi . | |
|---|---|---|---|
| 4,739,198 | 4/1988 | Maruyama | 307/530 |
| 5,321,319 | * 6/1994 | Mahmood | 307/443 |
| 5,828,260 | * 10/1998 | Taniguchi et al. | 327/387 |
| 5,831,458 | * 10/1999 | Nakagawa | 327/108 |
| 5,973,509 | * 10/1999 | Taniguchi et al. | 326/81 |
| 6,072,333 | * 6/2000 | Tsukagoshi et al. | 326/58 |
| 6,094,067 | * 7/2000 | Taniguchi | 326/81 |

FOREIGN PATENT DOCUMENTS

| 60-224325 | 8/1985 | (JP) . |
| 62-276921 | 12/1987 | (JP) . |
| 403053715A | * 3/1991 | (JP) . |
| 3-48523 | 3/1991 | (JP) . |
| 404004609A | * 1/1992 | (JP) . |
| 04035118 | 5/1992 | (JP) . |
| 5-335504 | 12/1993 | (JP) . |
| 6-29805 | 2/1994 | (JP) . |
| 8-8718 | 1/1996 | (JP) . |

* cited by examiner

*Primary Examiner*—Michael Tokar
*Assistant Examiner*—Daniel D. Chang
(74) *Attorney, Agent, or Firm*—Leydig, Voit & Mayer, Ltd

(57) ABSTRACT

To prevent a through current from flowing through a pair of MOS transistors of a final stage of a push-pull buffer circuit, a reset circuit is provided which receives signals individually from two inverter gate groups of a control system and an output system disposed at the stage preceding the push-pull buffer circuit, delays the input signals, and makes a logical decision on them. Even when an input/output circuit formed by two power supply systems becomes unstable at the time of power ON-OFF operation and the signal output from a signal level converter circuit yields logic that causes a through current flow into the final stage, the reset circuit forcedly cancels this logic by feedback.

17 Claims, 16 Drawing Sheets

US 6,278,294 B1

OUTPUT BUFFER CIRCUIT

TECHNICAL FIELD

The present invention relates to an output buffer circuit equipped with a function of converting the signal level between different power-supply voltages and, more particularly, to an output buffer circuit provided with a set of MOS transistors in its last stage.

BACKGROUND ART

FIG. 1 is a circuit diagram of a conventional output buffer circuit disclosed, for example, in Japanese Patent Application No. Hei. 7-176084, depicting the configuration of an input/output circuit of a semiconductor integrated circuit device equipped with a signal level converting function. In an output buffer of an interface circuit which is used between semiconductor integrated circuit devices that operate on different power supply voltages, such a half-latch type signal level converter as shown is used to convert the internal signal level from a low to a high voltage, and the output stage is formed by a push-pull circuit which has a buffer last stage made up of CMOS-structured inverter gates and NMOS-NMOS transistors.

Incidentally, what is intended to mean by the semiconductor integrated circuit device which possesses the signal converting function is a semiconductor integrated circuit device equipped with a function by which the signal voltage provided from a device operating on the power supply voltage in a large scale integrated circuit (LSI) is level converted for output to an external circuit which operates on a power-supply voltage different from that of the internal circuit, and a function by which a signal provided from a device operating on an external power-supply voltage different from the internal one is level converted to the signal voltage of the internal circuit for input thereinto.

In FIG. 1, reference numeral 1 denotes an input/output terminal; 2 denotes a control terminal; 3 denotes an input terminal; 4a and 4b denote first power-supply potential points to which a first power-supply voltage VDD1 is fed and second power-supply potential points to which a second power-supply voltage VDD2 is fed, respectively; 5 denotes ground potential points to which the ground potential GND is fed; 6 denotes an input/output control circuit; 7a and 7b denote a first converter circuit block and a second converter circuit block, respectively; and 8a denotes a buffer circuit. These circuit elements constitute an output buffer circuit 91a. Reference numeral 10 denotes an input buffer and 11 a static-shielding circuit.

To the input/output terminal 1 is connected an internal circuit via the input buffer 10. Connected further to the input/output terminal 1 via the output buffer circuit 91a are the control terminal 2 which is supplied with a control signal IN1 from the internal circuit and the input terminal 3 which is supplied with an output signal IN2 from the internal circuit.

The output buffer circuit 91a is composed principally of the input/output control circuit 6, the signal level converter circuit 7 and the buffer circuit 8a, and the control terminal 2 and the input terminal 3 are connected to the input/output control circuit 6. The input/output control circuit 6 outputs to the signal level converter circuit 7, and the signal level converter circuit 7 outputs to the buffer circuit 8a via connection points N13 and N23.

The input/output control circuit 6 and the first converter circuit block 7a forming the first half part of the signal level converter circuit 8 operate on the first power-supply voltage VDD1, which is also the power-supply voltage of the internal circuit, and the ground potential GND. On the other hand, the second converter circuit forming the second half part of the signal level converter circuit 7 and the buffer circuit 8a operate on the second power-supply voltage VDD2, which is generally higher in voltage level than the first power-supply voltage VDD1, and the ground potential. The first power-supply voltage VDD2 and the second power-supply voltage VDD2 are supplied via the power-supply potential points 4a and 4b, respectively, and the ground potential GND is supplied via the ground potential points 5.

A description will be given below of the cases where the control signal IN1 and the output signal IN2 that are applied to the control terminal 2 and the input terminal 3, respectively, are at the "H" level and at the "L" level.

When the control signal IN1 is at the "H" level, the output signal IN2 is at the "L" level and the signal level converter circuit 7 forces the connection points N13 and N23 to the "L" level (the ground potential GND) and the "H" level (the second power-supply voltage VDD2), respectively. As a result, transistors Q13 and Q14 of the buffer circuit 8a both turn OFF, making the buffer circuit 8a high-impedance relative to the input/output terminal 1. Hence, an external signal fed to the input/output terminal 1 is transmitted to the input buffer 10 with no loss.

On the other hand, when the control signal IN1 is at the "L" level and the output signal IN2 at the "L" level, the signal level converter circuit 7 forces either of the connection points N13 and N23 to the "L" level. As a result, the transistors Q13 and Q14 of the buffer circuit 8a turn ON and OFF, respectively, making the input/output terminal 1 "L" level.

And, when the control signal IN1 is the "L" level and the output signal IN2 at the "H" level, the signal level converter circuit 7 forces either of the connection points N13 and N14 to the "H" level. As a result, the transistors Q13 and Q14 of the buffer circuit 8a turn ON and OFF, respectively, making the input/output terminal 1 "H" level.

FIG. 2 schematically illustrates in section the transistors Q13 and Q14 forming the last stage of the buffer circuit 8a. Reference numeral 1 denotes an input/output terminal, 4b a second power-supply potential point, 5 a ground potential point, and N15 and N24 connection points. In P wells on a P-type semiconductor substrate connected to the ground potential point GND there are formed the NMOS transistors Q13 and Q14. The NMOS transistor Q13 has its drain electrode connected to the second power-supply potential point 4b, its gate electrode connected to the connection point N15, its source electrode connected to the input/output terminal 1 and its P well potential connected to the ground potential point 5. The NMOS transistor Q14 has its source electrode connected to ground potential point 5, its gate electrode connected to the connection point N24, its drain electrode connected to the output terminal 1 and its P well potential connected to the ground potential point 5.

FIG. 3 is a circuit diagram of another example of the conventional output buffer circuit, depicting the configuration of an input/output circuit of a semiconductor integrated circuit device equipped with the signal level conversion facility. Reference numeral 8b denotes a buffer circuit, which is a substitute for the buffer circuit 8a of the configuration shown in FIG. 1. More specifically, the buffer circuit 8b has a CMOS push-pull type output stage by replacing a PMOS transistor Q15 for the NMOS transistor Q13 in the final stage of the buffer circuit 8a and omits an inverter gate G18. Reference numeral 91b denotes the output buffer circuit.

FIG. 4 depicts in section the transistors Q15 and Q14 forming the final stage of the buffer circuit 8b. Reference numeral 1 denotes an input/output terminal, 4b a second power-supply potential point, 5 a ground potential point, N14 and N24 connection points, and Q14 and Q15 an NMOS and a PMOS transistor. In a P well on a P-type semiconductor substrate connected to the ground potential point GND there is formed the NMOS transistor Q14, which has its source electrode connected to the input/output terminal 1 and its P well potential connected to the ground potential point 5. On the other hand, the PMOS transistor Q15 is formed in an N well, and has its source electrode connected to the second power-supply potential point 4b, its gate electrode connected to the connection point N14 and its drain electrode connected to the input/output terminal 1.

With such a configuration, too, the circuit performs the same operations as described above in respect of FIG. 1. That is, when supplied at the gate with the "H" level or "L" level signal, the NMOS transistor Q14 and the PMOS transistor Q15 operate inversely to each other, but since the buffer circuit 8b of FIG. 3 does not have the inverter gate G18, no signal level inversion will occur and the both transistors will ultimately operate in the same fashion.

Accordingly, when the traditional output buffer circuit equipped with the signal level conversion facility performs its normal output operation, the pair of potentials at the connection points N13 and N23 assumes any one of the three states ("H" level, "H" level), ("L" level, "L" level) and ("L" level, "H" level) as in the two examples described above.

However, in the case where the first power-supply voltage VDD1 has not been supplied in the initial state in which the second power-supply voltage VDD2 has already been supplied, values of respective parts in the signal level converter circuit 7 are not unequivocally determined. For example, in FIG. 1 the pair of potentials at the connection points N13 and N23 can enter the state ("H" level, "L" level). This brings about a situation where the MOS transistors Q13 and Q14 (Q15, Q14 in FIG. 3) both turn ON simultaneously, giving rise to a problem that an unnecessary current, i.e. a through current flows between the second power-supply potential point 4b and the ground potential point 5.

The present invention is intended to solve such a problem as referred to above, and has for its object to provide an output buffer circuit of a circuit configuration that would reset the state in which a potential is provided corresponding to logic of flowing a through current across transistors forming the final stage of the output buffer circuit.

DISCLOSURE OF THE INVENTION

An output buffer circuit according to the invention comprises: first and second potential points which provide first and second potentials, respectively; an output point; a first conduction control element which has a control end for providing a third potential corresponding to either one of binary logical values consisting of first logic and second logic complementary thereto and which permits and inhibits the conduction between the first and second potential points when the third potential corresponds to the first logic and the second logic, respectively; a second conduction control element which has a control end for providing a fourth potential corresponding to either one of binary logical values consisting of third logic and fourth logic complementary thereto and which permits and inhibits the conduction between the second potential point and the output point when the fourth potential corresponds to the third logic and the fourth logic, respectively; through-current detection logic generating means for generating a through-current detection signal which starts when the third potential and the fourth potential correspond to the first logic and the third logic, respectively; and forced logic-application means which responds to the through-current detection signal to perform either one of a first logic applying function of forcedly applying the second logic to the control end of the first conduction control element and a second logic applying function of forcedly applying the fourth logic to the control end of the second conduction control element.

With this circuit configuration, even if the output buffer circuit enters a logic state in which a through current flows through the first and second conduction control elements because the first conduction control element receives first logic and allows the conduction between the first potential point and the output point and because the second conduction control element receives third logic and allows the conduction between the second potential point and the output point, the through-current detection logic generating means outputs a through-current detection signal to the forced logic-application means, which, in turn, forcedly applies the second logic to the control end of the first conduction control element or the fourth logic to the control end of the second conduction control element, thereby avoiding the logic state in which the through current flows.

In an output buffer circuit of the invention, the first logic and the third logic are complementary to each other.

With this configuration, the levels of the first and the third logic correspond to each other, which provides compatibility in signal conversion or the like.

In an output buffer circuit of the invention, the forced logic-application means includes first switching means which has one end for connection to the control end of the first conduction control element and the other end for providing a fifth potential corresponding to the second logic and conducts in response to the start of the through-current detection signal.

With this configuration, in the case where the first and the second conduction control element enter the first and the third logic state, respectively, and the through-current detection signal starts, the first switching means conducts and applies the second logic to the control end of the first conduction control element to thereby putting the first and the second conduction control element into the second and the third logic state to avoid the generation of the through current.

In an output buffer circuit of the invention, the forced logic-application means includes second switching means which has one end for connection to the control end of the second conduction control element and the other end for providing a fifth potential corresponding to the fourth logic and conducts in response to the start of the through-current detection signal.

With this configuration, in the case where the first and the second conduction control element enter the first and the third logic state, respectively, and the through-current detection signal starts, the first switching means conducts and applies the fourth logic to the control end of the second conduction control element to thereby putting the first and the second conduction control element into the first and the fourth logic state to avoid the generation of the through current.

In an output buffer circuit of the invention, the first conduction control element comprises a first MOS transistor of a first conductivity type which has a gate and a set of electrodes connected to the first potential point and the output point, respectively, and a first number of inverter gates connected in series between the control end of the first conduction control element and the gate of said first MOS transistor, and the second conduction control element comprises a second MOS transistor of the first conductivity type which has a gate and a set of electrodes connected to the second potential point and the output point, respectively, and a second number of inverter gates connected in series between the control end of the second conduction control element and the gate of the second MOS transistor, the second number having an odd-number difference from the first number.

With this configuration, the final stage of the buffer circuit can be formed by a pair of NMOS transistors and hence as an NMOS-NMOS push-pull buffer type.

In an output buffer circuit of the invention, the through-current detection logic generating part comprises a logic gate which outputs, as the through-current detection signal, the AND of the same logic as that corresponding to the third potential with logic complementary to that corresponding to the fourth potential, and the forced logic-application means performs the first logic applying function when receiving the same logic as that corresponding to the through-current detection signal.

With this configuration, the logic gate of the through-current detection logic generating means for performing processing to detect the through current can be formed by a combination of a NAND gate and an inverter gate.

In an output buffer circuit of the invention, the through-current detection logic generating part comprises a logic gate which outputs the NOT of the AND of logic complementary to that corresponding to the third potential with the same logic as that corresponding to the fourth potential, and the forced logic-application means performs the first logic applying function when receiving the same logic as that corresponding to the through-current detection signal.

With this configuration, the logic gate of the through-current detection logic generating means for performing processing to detect the through current can be formed by a NOR gate.

In an output buffer circuit of the invention, the through-current detection logic generating part comprises a logic gate which outputs, as the through-current detection signal, the NOT of the AND of the same logic as that corresponding to the third potential with logic complementary to that corresponding to the fourth potential, and the forced logic-application means performs the first logic applying function when receiving logic complementary to that corresponding to the through-current detection signal.

With this configuration, the logic gate of the through-current detection logic generating means for performing processing to detect the through current can be formed by a NAND gate.

In an output buffer circuit of the invention, the through-current detection logic generating part comprises a logic gate which outputs, as the through-current detection signal, the AND of the same logic as that corresponding to the third potential with logic complementary to that corresponding to the fourth potential, and the forced logic-application means performs the second logic applying function when receiving logic complementary to that corresponding to the through-current detection signal.

With this configuration, the logic gate of the through-current detection logic generating means for performing processing to detect the through current can be formed by a combination of a NAND gate and an inverter gate.

In an output buffer circuit of the invention, the through-current detection logic generating part comprises a logic gate which outputs the NOT of the AND of logic complementary to that corresponding to the third potential with the same logic as that corresponding to the fourth potential, and the forced logic-application means performs the second logic applying function when receiving logic complementary to that corresponding to the through-current detection signal.

With this configuration, the logic gate of the through-current detection logic generating means for performing processing to detect the through current can be formed by a NOR gate.

In an output buffer circuit of the invention, the through-current detection logic generating part comprises a logic gate which outputs, as the through-current detection signal, the NOT of the AND of the same logic as that corresponding to the third potential with logic complementary to that corresponding to the fourth potential, and the forced logic-application means performs the second logic applying function when receiving the same logic as that corresponding to the through-current detection signal.

With this configuration, the logic gate of the through-current detection logic generating means for performing processing to detect the through current can be formed by a NAND gate.

In an output buffer circuit of the invention, the first conduction control element comprises a first MOS transistor of a first conductivity type which has a gate and a set of electrodes connected to the first potential point and the output point, respectively, and a first number of inverter gates connected in series between the control end of said first conduction control element and the gate of the first MOS transistor, and the second conduction control element comprises a second MOS transistor of a second conductivity type complementary to the first conductivity type which has a gate and a set of electrodes connected to the second potential point and the output point, respectively, and a second number of inverter gates connected in series between the control end of the second conduction control element and the gate of the second MOS transistor, the second number having an even-number difference from the first number.

With this configuration, the final stage of the buffer circuit can be formed by a PMOS transistor and an NMOS transistors and hence as a CMOS push-pull buffer type.

In an output buffer circuit of the invention, the through-current detection logic generating part comprises a logic gate which outputs, as the through-current detection signal, the AND of the same logic as that corresponding to the third potential with logic complementary to that corresponding to the fourth potential, and the forced logic-application means performs the first logic applying function when receiving the same logic as that corresponding to the through-current detection signal.

With this configuration, the logic gate of the through-current detection logic generating means for performing processing to detect the through current can be formed by a combination of a NAND gate and an inverter gate.

In an output buffer circuit of the invention, the through-current detection logic generating part comprises a logic gate which outputs the NOT of the AND of logic complementary to that corresponding to the third potential with the same logic as that corresponding to the fourth potential, and the forced logic-application means performs the first logic applying function when receiving the same logic as that corresponding to the through-current detection signal.

With this configuration, the logic gate of the through-current detection logic generating means for performing processing to detect the through current can be formed by a NOR gate.

In an output buffer circuit of the invention, the through-current detection logic generating part comprises a logic gate which outputs, as the through-current detection signal, the NOT of the AND of the same logic as that corresponding to the third potential with logic complementary to that corresponding to the fourth potential, and the forced logic-application means performs the first logic applying function when receiving logic complementary to that corresponding to the through-current detection signal.

With this configuration, the logic gate of the through-current detection logic generating means for performing processing to detect the through current can be formed by a NAND gate.

In an output buffer circuit of the invention, the through-current detection logic generating part comprises a logic gate which outputs, as the through-current detection signal, the AND of the same logic as that corresponding to the third potential with logic complementary to that corresponding to the fourth potential, and the forced logic-application means performs the second logic applying function when receiving logic complementary to that corresponding to the through-current detection signal.

With this configuration, the logic gate of the through-current detection logic generating means for performing processing to detect the through current can be formed by a combination of a NAND gate and an inverter gate.

In an output buffer circuit of the invention, the through-current detection logic generating part comprises a logic gate which outputs the NOT of the AND of logic complementary to that corresponding to the third potential with the same logic as that corresponding to the fourth potential, and the forced logic-application means performs the second logic applying function when receiving logic complementary to that corresponding to the through-current detection signal.

With this configuration, the logic gate of the through-current detection logic generating means for performing processing to detect the through current can be formed by a NOR gate.

In an output buffer circuit of the invention, the through-current detection logic generating part comprises a logic gate which outputs, as the through-current detection signal, the NOT of the AND of the same logic as that corresponding to the third potential with logic complementary to that corresponding to the fourth potential, and the forced logic-application means performs the second logic applying function when receiving the same logic as that corresponding to the through-current detection signal.

With this configuration, the logic gate of the through-current detection logic generating means for performing processing to detect the through current can be formed by a NAND gate.

In an output buffer circuit of the invention, a first power-source level system includes a signal level converter circuit which provides the third and fourth potentials based on at least a first signal of binary logic, and the first to fourth potentials each correspond to either one of binary logical values in a second power-supply level system different from the first power-supply level system.

By this, the output buffer circuit can be configured to have a signal level conversion facility.

In an output buffer circuit of the invention, the first power-supply level system includes an output control part which outputs a first signal in response to a second signal of a pair of signals of said binary logic, and a pair of the third and fourth potential corresponds to a pair of first and fourth logic, a pair of second and third logic, or a pair of second and fourth logic.

By this, the output buffer circuit can be configured to have a tristate type output control part at the stage preceding the signal level converter circuit.

In an output buffer circuit of the invention, the signal level converter circuit comprises a first half part composed of a plurality of MOS transistors, for performing logical processing of the first signal, and a second half part composed of a plurality of MOS transistors, for providing the third and fourth potentials, the second power-supply level system has a potential difference greater than in said first power-supply level system, and the plurality of MOS transistors forming the second half part have gate insulating films thicker than those of the MOS transistors forming the first half part.

By forming thick the gate insulating films of the MOS transistors contained in the second power supply level system to which a relatively high potential is supplied, a dielectric breakdown can be avoided.

An output buffer circuit of the invention, includes conditioning means which performs the function of the forced logic-application means only when the starting time of a detector circuit contained in the through-current detection logic generating means is longer than a specified time.

By this, in the case where the logic state in which the through current flows is transient like at the time of transient switching and forced logic need not be applied, it is possible to prevent the occurrence of a malfunction by means of feedback to the started through-current detection signal.

In an output buffer circuit of the invention, the conditioning means comprises a delay element which delays the through-current detection signal by the specified time and outputs a delayed detection signal, and a logic gate which starts up when the logic corresponding to the through-current detection signal and the logic corresponding to the delayed detection signal are both in a special logic state.

By this, is possible to prevent the occurrence of a malfunction by deciding, by the delay element and the logic gate, whether to feed back forced logic.

In an output buffer circuit of the invention, the delay element is formed by an even number of inverter gates.

By this, the input terminal of the logic gate can receive a signal delayed only by its transfer time without changing its logical level, and consequently, it is possible to provide the feedback more closely.

BEST MODE FOR CARRYING OUT THE INVENTION

To facilitate a better understanding of the present invention, a description will be given, with reference to the accompanying drawings, of the best mode for carrying out the invention.

Embodiment 1

Figure 1:
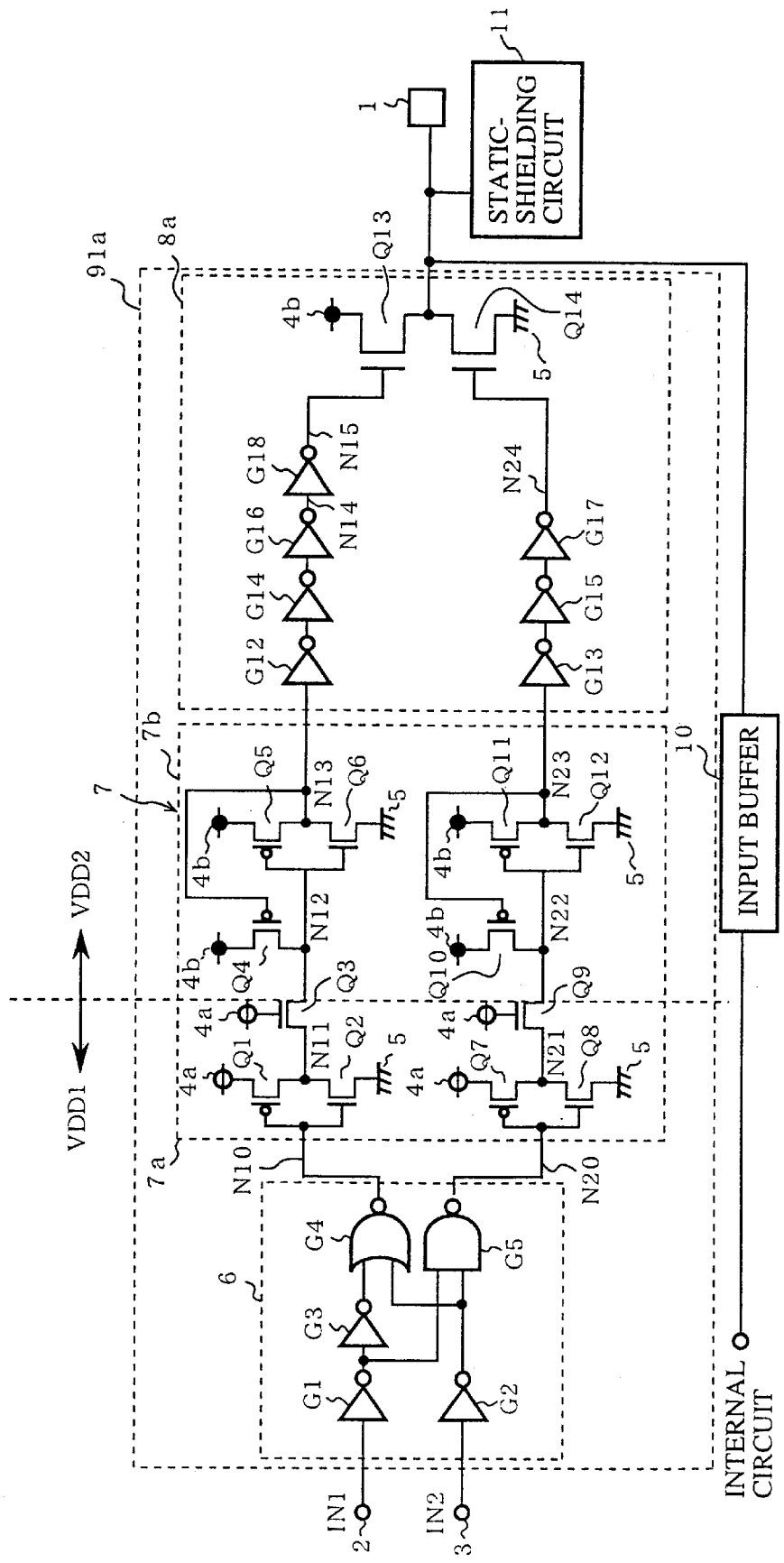
FIG. 1 is a circuit diagram depicting the configuration of a prior art example.
Figure 2:
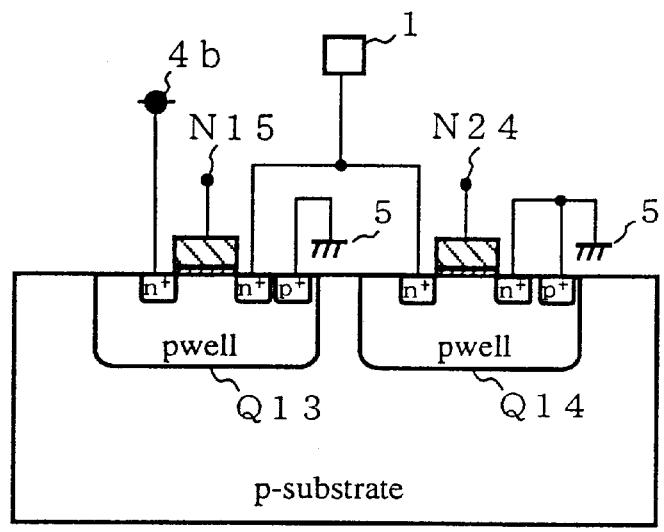
FIG. 2 is a cross-sectional view of the configuration of one part forming the above prior art example.
Figure 4:
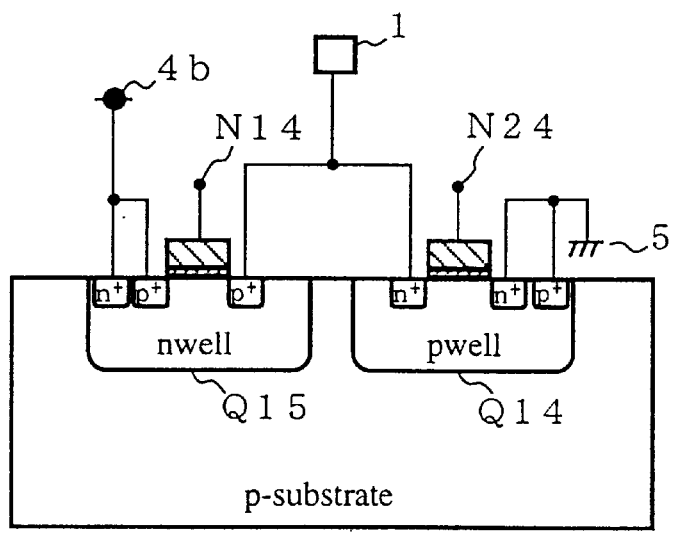
FIG. 4 is a cross-sectional view of the configuration of one part forming the second-mentioned prior art example.
Figure 3:
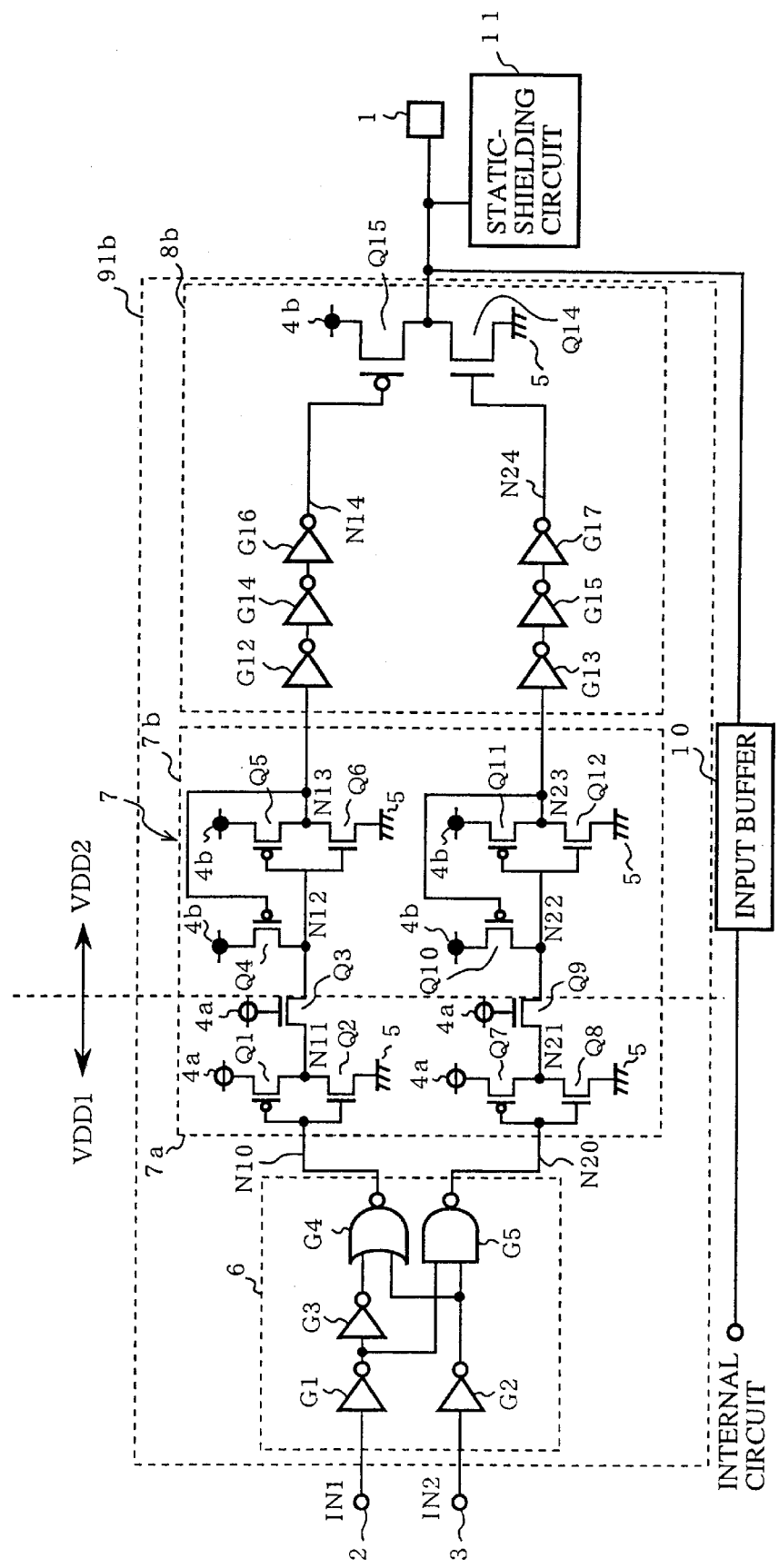
FIG. 3 is a circuit diagram depicting the configuration of another prior art example.
Figure 5:
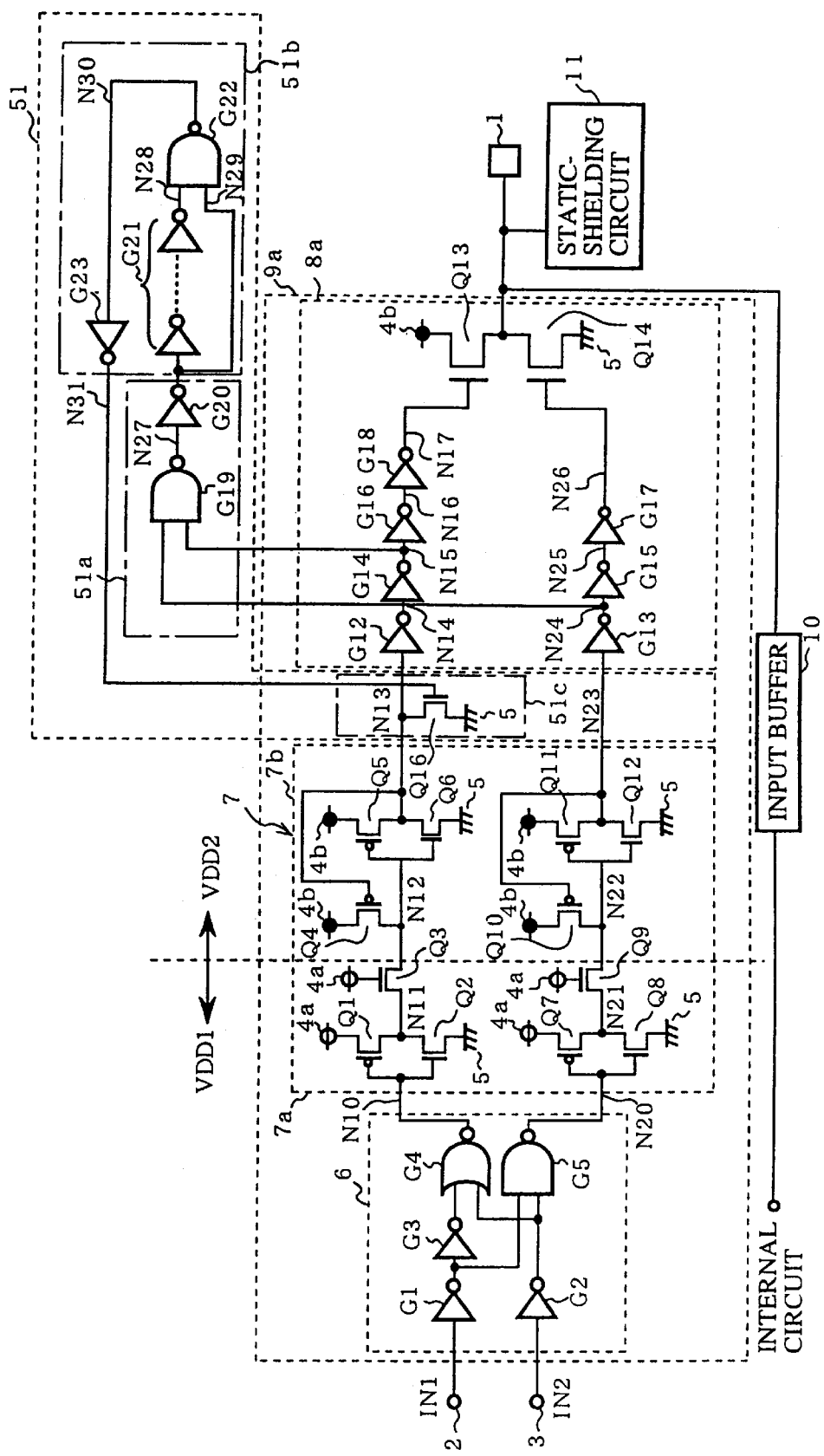
FIG. 5 is a circuit diagram illustrating the configuration of Embodiment 1 of the present invention.

FIG. 5 is a circuit diagram of an output buffer circuit according to Embodiment 1 of the present invention, depicting the configuration of an input/output circuit of a semiconductor integrated circuit device equipped with the signal level conversion facility. In FIG. 5, reference numeral 1 denotes an input/output terminal; 2 denotes a control terminal; 3 denotes an input terminal; 4a and 4b denote first power-supply potential points to which a first power-supply voltage VDD1 is fed and second power-supply potential points to which a second power-supply voltage VDD2 is fed, respectively; 5 denotes ground potential points to which the ground potential GND is fed; 6 denotes an input/output control circuit; 7a and 7b denote a first converter circuit block and a second converter circuit block, respectively; 8a denotes a buffer circuit; and 51 denotes first reset circuit. These circuit elements constitute an output buffer circuit 9a. Reference numeral 10 denotes an input buffer and 11 a static-shielding circuit.

To the input/output terminal 1 is connected an internal circuit via the input buffer 10. Connected further to the input/output terminal 1 via the output buffer circuit 9a are the control terminal 2 which is supplied with a control signal IN1 from the internal circuit and the input terminal 3 which is supplied with an output signal IN2 from the internal circuit.

The static-shielding circuit 11 goes into the low-impedance state when supplied with a high-potential external input signal via the input/output terminal and the high-impedance state when supplied with a low-potential or operating-voltage external input signal, thus protecting the input/output circuit against an electrostatic discharge failure. The static-shielding circuit 11 is formed, for example, using a structure in which a junction diode and a resistance element using a diffused layer and a polysilicon layer are combined on a substrate.

In FIG. 5, "VDD1 ∗" indicates the range over which the circuit is driven by the first power-supply potential VDD1 that is the power-supply voltage of the internal circuit, and "VDD ∃" indicates the range over which the circuit is driven by the second power-supply potential VDD2, where VDD2>VDD1.

The input buffer 10 is made up of: a circuit by which an external input signal whose "H" and "L" levels are defined by the second power-supply potential VDD2 and the ground potential GND is subjected to a signal-level conversion to a signal whose "H" and "L" levels are defined by the first power-supply potential VDD1 and the ground potential GND; and an input driver circuit.

The output buffer circuit 9a is composed principally of the input/output control circuit 6, the signal level converter circuit 7 and the buffer circuit 8a, and the control terminal 2 and the input terminal 3 are connected to the input/output control circuit 6. The input/output control circuit 6 outputs to the signal level converter circuit 7, and the signal level converter circuit 7 outputs to the buffer circuit 8a via connection points N13 and N23.

The input/output control circuit 6 comprises inverter gates G1 to G3, a two-input NOR gate G4 and two-input NAND gate G5, and constitutes a tristate input/output control circuit.

The inverter gate G1 is connected to the control terminal 2, and the inverter gate G2 is connected to the input terminal 3. The inverter gate G3 has its input terminal connected to the output terminal of the inverter gate G1, and the two-input NAND gate G5 has its first input terminal connected to the output terminal of the inverter gate GI and its second input terminal connected to the output terminal of the inverter gate G2. And, the two-input NOR gate G4 has its first input terminal connected to the output terminal of the inverter gate G3 and its second input terminal connected to the output terminal of the inverter gate G3. The output terminal of the NOR gate G4 and the output-terminal of the NAND gate G5 are connected to a connection point N10 and a connection point N20, respectively, through which they are connected to a first converter circuit block 7a which constitutes the first half part of the signal level converter circuit 7 of the next stage.

The signal level converter circuit 7 comprises: PMOS transistors Q1 and Q7; NMOS transistors Q2 and Q8; NMOS transfer gates Q3 and Q9; and PMOS transistors Q4, Q5, Q10 and Q11 and NMOS transistors Q6 and Q12 which form a latch-type level converter circuit.

The signal level converter circuit 7 is made up of the first converter circuit block 7a that operates on the first power-supply potential and the ground potential GND and a second converter circuit 7b which operates on the second power-supply potential and the ground potential GND.

In the first converter circuit block 7a, the PMOS transistor Q1 and the NMOS transistor Q2, which constitute a first inverter, have their gate electrodes connected to the output point N10 of the input/output control circuit 6, and the PMOS transistor Q7 and the NMOS transistor Q8, which constitute a second inverter, have their gate electrodes connected to the output point N20 of the input/output control circuit 7. The transfer gate Q3 has its source electrode connected to a connection point N11 which serves as the drain electrodes of the PMOS transistor Q1 and the NMOS transistor Q2 and its gate connected to the first power-supply potential point 4a. The transfer gate Q9 has its source electrode connected to a connection point N21 which serves as the drain electrodes of the PMOS transistor Q7 and the NMOS transistor Q8 and its gate electrode connected to the first power-supply potential point 4a.

The second converter circuit block 7b contains first and second latch circuits.

The first latch circuit has such a construction as described below. The PMOS transistor Q5 has its source electrode connected to the second power-supply potential point 4b and its gate electrode connected to a connection point N12 which is the drain electrode of the transfer gate Q3, and the NMOS transistor Q6 has its source electrode connected to the ground potential point 5 and its gate electrode connected to the connection point N12. And, the PMOS transistor Q4 has its source electrode connected to the second power-supply potential point 4b and its gate electrode connected to a connection point N13 which serves as the drain electrodes of the PMOS transistor Q5 and the NMOS transistor Q6.

The second latch circuit has such a construction as described below. The PMOS transistor Q11 has its source electrode connected to the second power-supply potential point 4b and its gate electrode connected to a connection point N22 which is the drain electrode of the transfer gate Q9, and the NMOS transistor Q12 has its source electrode connected to the ground potential point 5 and its gate electrode connected to the connection point N22. And, the PMOS transistor Q10 has its source electrode connected to the second power-supply potential point 4b and its gate electrode connected to a connection point N23 which serves as the drain electrodes of the PMOS transistor Q11 and the NMOS transistor Q12.

The signal level converter circuit 7 has two kinds of signal-flow paths. One is a control-system signal-flow path which receives the output from the control circuit 6 (at the connection point N10) and conveys it to the connection point N13 after converting its signal level during the signal transfer, and the other is an output-signal-system signal-flow path which receives the output from the control circuit 6 (at the connection point N20) and conveys it to the connection point N23 similarly after converting its signal level during the signal transfer. Accordingly, the signal level converter circuit 7 has two level converting circuits. The first level converting circuit of the control signal system comprises the PMOS transistors Q1, Q4 and Q5 and the NMOS transistors Q2, Q3 and Q6. The second level converting circuit of the output signal system comprises the PMOS transistors Q7, Q10 and Q11 and NMOS transistors Q8, Q9 and Q12.

With a view to avoiding a dielectric breakdown, the gate insulating films of the MOS transistors including the PMOS transistors Q4, Q5, Q1O and Q11, the NMOS transistors Q3, Q6, Q9 and Q12 and final-stage NMOS transistors Q13 and Q14 forming the buffer circuit 8a are formed thicker than the gate insulating films of the MOS transistors forming the input/output control circuit 6, the PMOS transistors Q1 and Q7 and the NMOS transistors Q2 and Q8.

The buffer circuit 8a is formed by a push-pull circuit made up of CMOS-structured inverter gates G12 to G18 and the final stage formed by the NMOS transistors Q13 and Q14.

In the buffer circuit 8a the input end of the inverter gate G12 is connected via the connection point N13 to the signal level converter circuit 7. The input end of the inverter gate G14 is connected to the output end of the inverter gate G12, the input end of the inverter gate G16 to the output end of the inverter gate G14, and the input end of the inverter gate G18 to the output end of the inverter gate G16. The output end of the inverter gate G18 is connected via a connection point N17 to the gate electrode of the PMOS transistor Q13. Accordingly, an even number of inverter gates are interposed between the connection points N13 and N15, and a potential corresponding to the same logic as that corresponding to the potential fed to the connection point N13 is provided via the connection point N17 to the gate electrode of the PMOS transistor Q13.

The input end of the inverter gate G13 is connected via the connection point N23 to the signal level converter circuit 7. The input end of the inverter gate G15 is connected to the output end of the inverter gate G13, the input end of the inverter gate G17 is connected to the output end of the inverter gate G15, and the output terminal of the inverter gate G17 is connected via a connection point N26 to the gate electrode of the NMOS transistor Q14. Accordingly, an odd number of inverter gates are interposed between the connection points N23 and 26, and a potential corresponding to logic opposite to that corresponding to the potential fed to the connection point N23 is provided via the connection point N26 to the gate electrode of the NMOS transistor Q14.

The first reset circuit 51 is composed of a through-current detection logic generating part 51a, conditioning part 51b, and a forced logic-application part 51c.

The through-current detection logic generating part 51a comprises a NAND gate G19 which has its first input terminal connected to the connection point N15 and its second input terminal connected to a connection point N24, and an inverter gate G20 connected to the output terminal of the NAND gate G19.

The conditioning part 51b comprises a delay circuit G21 composed of an even number of inverter gates connected to the output terminal of the inverter gate G20, a NAND gate G22 connected at its first input terminal to the output terminal of the inverter gate G20 and at its second input terminal to the output terminal of the delay circuit G21, and an inverter gate G23 connected to the output terminal of the NAND gate G22.

The forced logic-application part 51c is formed by an NMOS transistor Q16 which has a source electrode connected to the ground potential point 5, a gate electrode for receiving the output from the conditioning part 51b via the inverter gate G23 and a drain electrode connected to the connection point N13 that is the output terminal of the first level converting circuit.

The first reset circuit 51 is formed by MOS transistors, and their gate insulating films are thicker than those of the MOS transistors forming the input/output control circuit 6 and the first converter circuit block 7a.

A description will be given below of the operation of the input/output circuit constructed as described above. The semiconductor integrated circuit device of FIG. 5 has a circuit configuration that the signal from an LSI internal circuit of the first power-supply potential (VDD1) system can be level converted for supply to an electronic device of the second power-supply potential (VDD2) system outside the LSI. The operation of the circuit will be described in connection with the normal condition under which two power supplies (VDD1 and VDD2) are both connected to the input/output circuit and an abnormal condition under which the power supply (VDD 1) for the internal circuit operation cannot be connected to the input/output circuit but only the external power supply is connected.

A description will be given first of the normal mode of operation in which the first and second power-supply potentials VDD1 and VDD2 are both applied to the circuit.

When the control signal IN1 is at the "H" level, the NOR gage G4 and NAND gate G5 yield "L" and "H" level outputs, respectively, regardless of whether the output signal IN2 is at the "L" or "H" level. When applied to the signal level converter circuit 7, these output signals are inverted in signal level by the first converter circuit block 7a and the second converter circuit block 7b, providing "L" output (ground potential GND) and "H" level output (second power-supply potential VDD2) at the connection points N13 and N23, respectively. Hence, the "L" level signal is applied to both of the connection points N17 and N26. On receiving the "L" level signal, the transistors Q13 and Q14 of the buffer circuit 8a both turn OFF, making the buffer circuit 8a high-impedance with respect to the input/output terminal 1. As the result of this, an external signal fed to the input/output terminal 1 is transferred to the input buffer 10 with no loss.

When the control signal IN1 is at the "L" level and the output signal IN2 is also at the "L" level, the NOR gate G4 and the NAND gate G5 both output "L" level signals. These signal are inverted in signal level by the signal level converter circuit 7 to provide "L" level signals at the both connection points N13 and N23. As a result, the transistors Q13 and Q14 of the buffer circuit 8a turns OFF and ON, respectively, outputting an "L" level signal corresponding to the ground potential GND at the input/output terminal 1 from the ground potential point 5.

In this instance, "L" and "H" level signals are applied to the connection points N15 and N24, respectively, and the through-current detection logic generating part 51a transfers the "L" level signal to the conditioning part 51b via the NAND gate G19 and the inverter gate G20. Since the logical level at the connection point N24 goes to the "L" level, the logical levels at connection points N30 and N31 go to the "H" and "L" levels, respectively. Hence, the NMOS transistor Q16 of the forced logic-application part 51c turns OFF and does not operate.

In the case where the control signal IN1 is at the "L" level and the output signal IN2 at the "H" level, the NOR gate G4 and the NAND gate G5 both output "H" level signals. These output signals are inverted in signal level by the signal level converter circuit 7, providing "H" level signals at the both connection points N13 and N23. Accordingly, the "H" and "L" level signals are applied to the connection points N17 and N26, and as a result, the final-stage transistors Q13 and Q14 of the buffer circuit 8a turn ON and OFF, respectively, and the "H" level signal corresponding to the second power-supply potential is provided to the input/output terminal 1 from the second power-supply potential point 4b.

In this case, "H" and "L" level signals are fed to the connection points N15 and N24, respectively, and the through-current detection logic generating part 51a transfers the "L" level signal to the conditioning part 51b. Since the logical level at a connection point N29 is the "L" level, the logical levels at the connection points N30 and 31 are the "H" and the "L" level, respectively. Hence, the NMOS transistors Q13 and Q14 of the forced logic-application part 51c both turn OFF and remain out of operation.

The issue here is the circuit condition in which to generate a reset signal, and this is the case where the final-stage NMOS transistors Q13 and Q14 both turn ON at the same time, and consequently, the case where the gate electrodes of the both NMOS transistors Q13 and Q14 go to the "H" level. However, even at the time of transient switching that can occur during normal operation, too, the first NAND gate G19 of the through-current detection logic generating part 51a yields an "L" level signal (a reset signal) (the waveform identified by n27 in FIG. 17 described later on) in the cases where the signal at the connection point N24 of the first input terminal of the NAND gate changes from the "L" to the "H" level and where the signal at the connection point N15 of the second input terminal changes from the "H" to the "L" level. The state at such a transient switching time does no matter, but the input/output should not be reset y this reset signal.

To avoid the resetting of the input/output circuit, a delayed version of the output signal from the inverter gate G20, obtained by delaying it by the delay circuit G21 connected to the second input terminal of the second NAND gate G22 of the conditioning part 51b, and an undelayed version of the gate output signal are compared and an appropriate correction is made accordingly. Incidentally, the delay time of the delay circuit G21 is required to be shorter than the period T of the circuit operation.

As the result of the above, the output at the connection) point N30 goes to the "H" level and the output from the inverter gate G23 of the conditioning part 51b goes to the "L" level at the connection point N31, turning OFF the NMOS transistor Q16 of the forced logic-application part 51c. Thus, the output buffer circuit 9a is not reset and no influence is exerted on the output circuit operation.

The operation of the first reset circuit 51 during normal condition will be described below using a timing chart.

Figure 17:
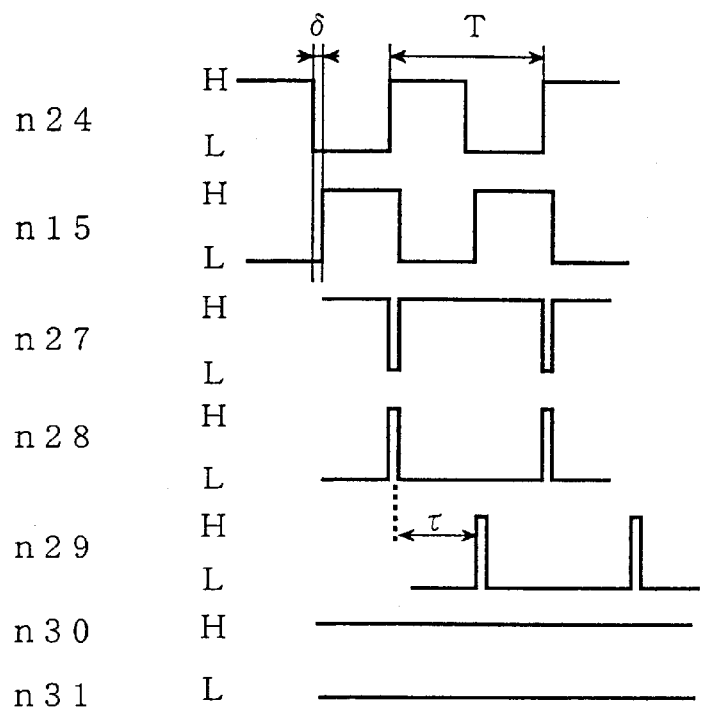
FIG. 17 is a timing chart showing the operation of the circuit according to Embodiment 1 of the present invention under normal conditions.

FIG. 17 is a timing chart depicting the operation of the first reset circuit 51 under normal condition in which the first and second power-supply potentials VDD1 and the second power-supply potential VDD2 are both provided in the input/output circuit in Embodiment 1. In FIG. 17, reference numerals n24, n15, n27, n28, n29, n30 and n31 correspond to the connection points N24, N15, N27, N28, N29, N30 and N31 in Embodiment 1, respectively.

For example, when the control signal IN1 is at the "L" level and the output signal IN2 is at the "H" level, the signal level is "L" at the connection point N24 and "H" at the connection point N15. When the control signal IN1 is at the "L" level and the output signal IN2 at the "L" level, the signal level is "H" at the connection point N24 and "L" at the connection point N15.

In this instance, the control signal IN1 is at the "L" level and the output signal IN2 at the "H" level, but the logical levels at the connection points N13 and N23 repeatedly toggle between the "H" and the "L" level at time intervals T and at substantially the same time. Accordingly, the logical levels at the connection points N15 and N24 also repeatedly toggle between the "H" and the "L" level at time intervals T. However, the logical transformation at the connection point N15 is delayed behind the logical transformation at the connection point N24 by a time interval δ during which the signal passes through the inverter gate G14 between the connection points N14 and N15. Hence, a pulse width δ occurs at the connection point N27 due to the transient switching even under normal condition. But this pulse is delayed by the delay circuit G21 by a time interval τ before it reaches the connection point N28, and if the pulse width δ is shorter than the delay time τ, then the logical levels at the connection points N30 and N31 remain "H" and "L," respectively. Accordingly, no forced logic is applied when unnecessary.

To implement such a desirable operation, the delay time t may preferably be chosen longer than the pulse width (which is a delay time by the gate) but shorter than the period T. The reason for this is that the AND of the current pulse with the next pulse transferred to the connection point N29 would otherwise go to the "H" level.

Next, a description will be given of the operation of the first reset circuit under abnormal condition.

The state that becomes an issue is the case where the final-stage NMOS transistors Q13 and Q14 both turn ON at the same time as referred to previously, and consequently, the case where the gate electrodes of the final-stage NMOS transistors Q13 and Q14 both go to the "H" level. The reason for this is given below. Since the first power-supply potential (VDD1) is not supplied but only the second power-supply potential (VDD2) is supplied, output signals from circuits which are driven by the first power-supply potential are unstable in the signal level converter circuit 7, and outputs from circuits which are supplied with such outputs and driven by the second power-supply potential become unstable accordingly; for example, when the signal level converter circuit 7 enters the state in which its output is "H" at the connection point N13 and "L" at the connection point N23, a current flows through the final-stage NMOS transistors Q13 and Q14 of the buffer circuit from the second power-supply potential point to the ground potential point. This problem could be solved by detecting such a state of the first reset circuit 51 by the buffer circuit 8a and feeding back the detected output to the connection point to which the signal level converter circuit 7 provides its output.

The operation of the first reset circuit 51 under in the abnormal mode of operation will be described below using a timing chart.

Figure 18:
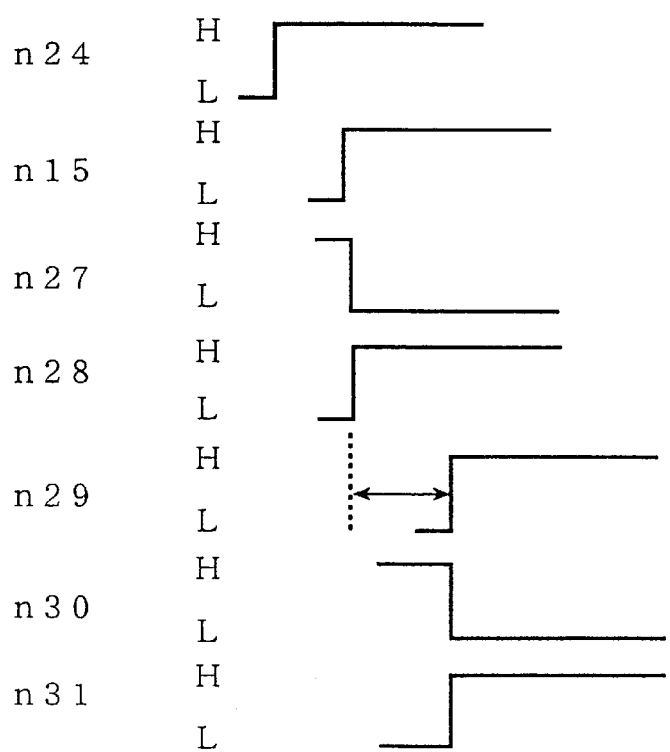
FIG. 18 is a timing chart showing the operation of the circuit according to Embodiment 1 of the present invention under abnormal conditions.

FIG. 18 is a timing chart showing the operation of the first reset circuit under the abnormal condition in which the first power-supply potential VDD1 is not supplied to the input/output circuit of Embodiment 1 but only the second power-supply potential VDD2 is supplied.

In FIG. 18, reference numerals n24 to n31 correspond to the connection points N24 to N31 in FIG. 5 depicting Embodiment 1.

In the through-current detection logic generating part 51a, the first NAND gate G19 is supplied at its first and second input terminals with signals fixed at the "H" level as indicated by n15 and n24 in FIG. 18, and the NAND gate output (waveform n27) is fixed at the "L" level and applied to the first inverter G20. The inverter output (waveform n28) is branched into two, the one (waveform n29) of which is fed via the delay circuit G21 to the second input terminal of the second NAND gate G22 of the conditioning part 51b and the other (waveform n28) of which is fed directly to the first input terminal of the second NAND gate G22; the both inputs are compared to compute the difference. As a result, the NAND gate G22 provides an "L" level output (waveform n30), which is inverted by the second inverter G23 to an "H" level output (waveform n31), allowing the NMOS transistor Q13 to turn ON.

In consequence, the potential at the connection point N13 goes to the "L" level and an "L" level signal is applied to the gate electrode of the final-stage NMOS transistor Q13, turning it OFF. In this case, when the potential at the connection point N23 goes to the "L" level, an "H" level signal is fed to the gate electrode of the final-stage NMOS transistor Q14, turning it ON. Since the transistor Q13 is OFF, however, the turning-ON of the transistor Q14 will cause no current flow from the second power-supply potential point to the ground potential point.

As described above, Embodiment 1 makes it possible to prevent an abnormal through current in the final stage of the buffer circuit only by resetting the "H" level output of the first signal level converter circuit to the "L" level.

Next, a modified form of Embodiment 1 will be described below.

Figure 11:
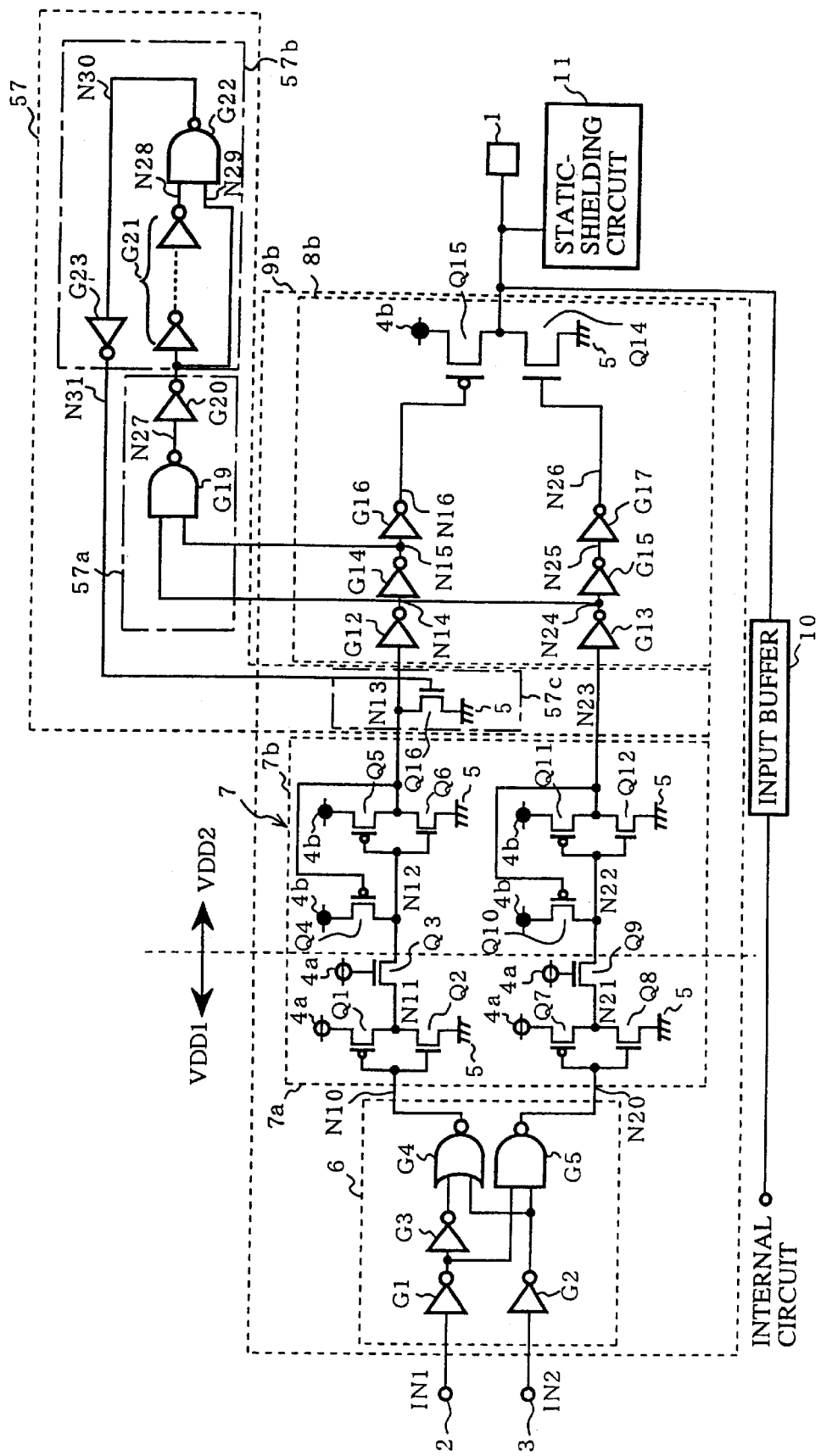
FIG. 11 is a circuit diagram illustrating the configuration of a modified form of Embodiment 1 of the present invention.

FIG. 11 is a circuit diagram of the modified form. Since this modification is identical in circuit configuration with Embodiment 1 of FIG. 5 except a buffer circuit 8b, the parts identical with those in the FIG. 5 embodiment are identified by the same reference numerals and no description will be repeated thereof.

The buffer circuit 8b differs from the buffer circuit 8a in that the inverter chain for conveying the "H" level signal is formed by an odd number of inverter gates G12, G14 and G16 and that the final stage has the circuit configuration of a CMOS push-pull buffer composed of a PMOS transistor Q15 which has its source electrode connected to the second power-supply potential point 4b, its gate electrode connected to the connection point N16 and its drain electrode connected to the input/output terminal 1 and an NMOS transistor Q14 which has its source electrode connected to the ground potential point 5, its gate connected to the connection point N26 and its drain electrode connected to the input/output terminal 1. Since the gate electrodes of the MOS transistors forming the buffer circuit 8b are driven by the second power-supply potential, they are protected against a dielectric breakdown by forming their gate insulating films to thicknesses greater than those of the MOS transistors forming the input/output circuit control circuit 6 and the first converter circuit block 7a.

With the circuit configuration of this modified form, too, it is possible, as is the case with Embodiment 1, to prevent the abnormal through current in the final stage of the buffer circuit simply by resetting the "H" level output of the first signal level converter circuit to the "L" level.

Embodiment 2

Figure 6:
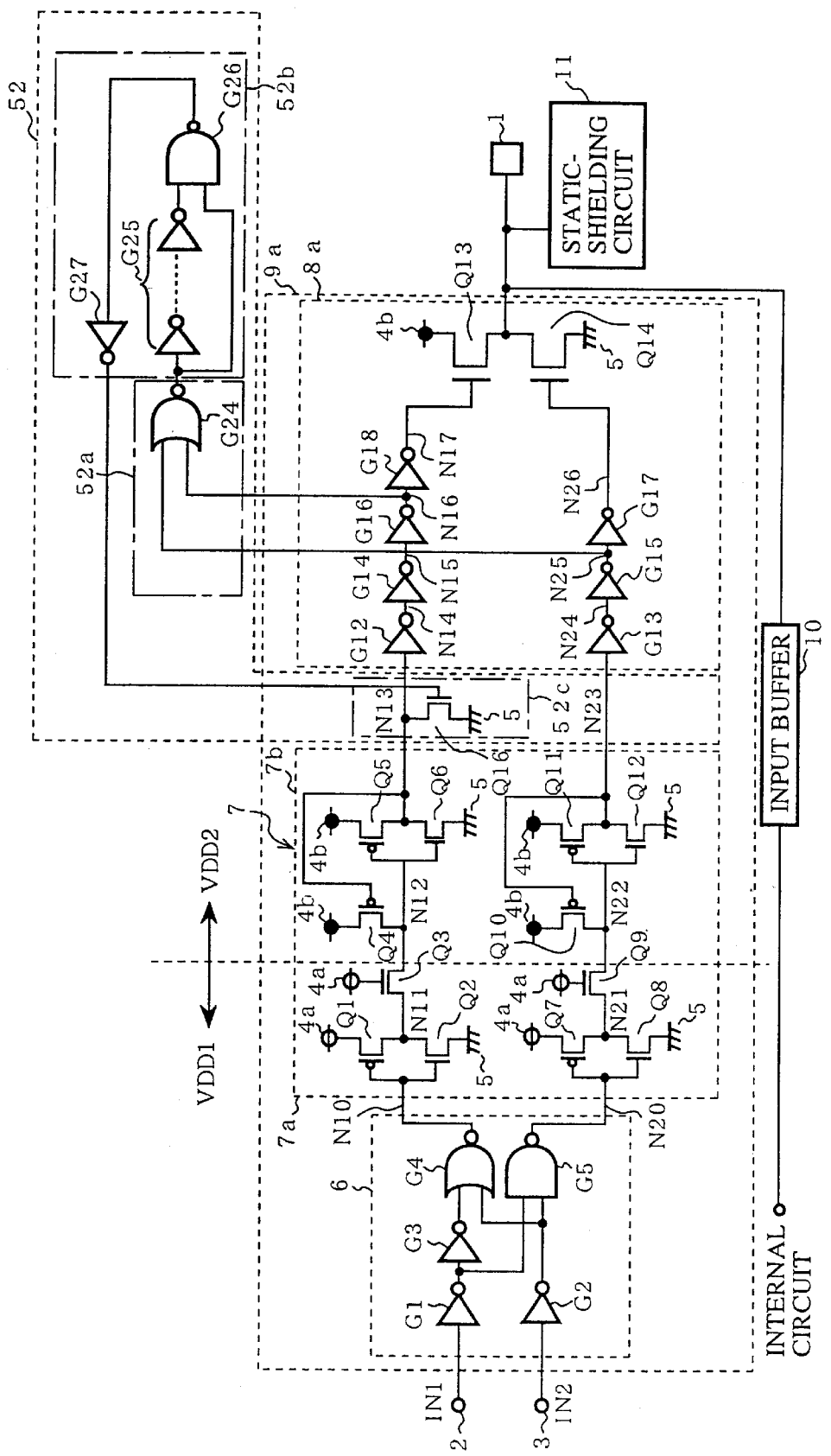
FIG. 6 is a circuit diagram illustrating the configuration of Embodiment 2 of the present invention.

FIG. 6 is a circuit diagram of an output buffer circuit according to Embodiment 2 of the present invention, depicting the configuration of an input/output circuit of a semiconductor integrated circuit device equipped with the signal level conversion facility. Since the illustrated embodiment is identical in circuit configuration with Embodiment 1 of FIG. 5 except a second reset circuit 52, the parts identical with those in the latter are identified by the same reference numerals, of which no description will be repeated.

The second reset circuit 52 in Embodiment 2 is made up of a through-current detection logic generating part 52a, a conditioning part 52b and a forced logic-application part 52c.

The through-current detection logic generating part 52a is formed by a NOR gate G24 which has its first input terminal connected to a connection point N16 and its second input terminal connected to a connection point N24.

The conditioning part 52b comprises a delay circuit G25 composed of an even number of inverter gates connected to the output terminal of the NOR gate G24, a NAND gate G26 connected at its first input terminal to the output terminal of the NOR gate G24 and at its second input terminal to the output terminal of the delay circuit G25, and an inverter gate G27 connected to the output terminal of the NAND gate G26.

The forced logic-application part 52c is formed by an NMOS transistor Q16 which has a source electrode connected to the ground potential point 5, a gate electrode for receiving the output from the conditioning part 52b via the inverter gate G27 and a drain electrode connected to the connection point N13 that is the output terminal of the first level converting circuit.

The second reset circuit 52 is formed by MOS transistors, and their gate insulating films are thicker than those of the MOS transistors forming the input/output control circuit 6 and the first converter circuit block 7a.

The operation of the input/output circuit of the above circuit configuration will be described. The circuit operation will be described in connection with the normal mode of operation in which first and second two power-supply potentials (VDD1 and VDD2) are both normally applied to the buffer circuit 9a and an abnormal mode of operation in which the first power-supply potential VDD1 for the internal circuit operation does not turn ON but only the second power-supply potential VDD2 for external power supply turns ON.

The circuit operation under normal condition is the same as described previously in respect of Embodiment 1. In this instance, the second reset circuit 52 operates so that the NAND gate G26 yields an "H" level output, and the output of the inverter gate G27 goes to the "L" level, which is applied to the gate of the NMOS transistor Q13. As a result, the NMOS transistor Q16 turns OFF, so that the forced logic-application part 52c does not operate, and consequently, no influence is exerted on the output operation of the buffer circuit 9a.

Next, a description will be given of the operation under abnormal condition. The state that becomes an issue is the case where the final-stage NMOS transistors Q13 and Q14 both turn ON at the same time, and consequently, the case where the gate electrodes of the NMOS transistors Q13 and Q14 both go to the "H" level. The reason for this is the same as given previously with reference to Embodiment 1. Since the first power-supply potential (VDD1) is not supplied but only the second power-supply potential (VDD2) is supplied, output signals from circuits which are driven by the first power-supply potential are unstable in the signal level converter circuit 7, and outputs from circuits which are supplied with such outputs and driven by the second power-supply potential become unstable accordingly; for example, when the signal level converter circuit 7 enters the state in which its output is "H" at the connection point N13 and "L" at the connection point N23, a through current flows through the final-stage NMOS transistors Q13 and Q14 of the buffer circuit 8a from the second power-supply potential point to the ground potential point. This problem could be solved by detecting such a state of the second reset circuit 52 by the buffer circuit 8a, then performing some logical manipulation on the detected output, and feeding it back to the signal level converter circuit 7 of the preceding stage.

In the state in question wherein the NMOS transistors Q13 and Q14 forming the final stage are both in the ON state, the first and second input terminals of the NOR gate G24 in the through-current detection logic generating part 52a each receive a signal fixed at the "L" level and output an "H" level signal. The gate output (waveform n28) is branched into two, the one of which is fed via the delay circuit G25 to the second input terminal of the NAND gate G26 of the conditioning part 52b and the other of which is fed directly to the first input terminal of the NAND gate G26; the both inputs are compared. As a result, the NAND gate G26 provides an "L" level output, which is inverted by the inverter gate G27 to an "H" level output, allowing the NMOS transistor Q16 of the forced logic-application part 52c to turn ON.

In consequence, the potential at the connection point N13 goes to the "L" level and an "L" level signal is applied to the gate electrode of the final-stage NMOS transistor Q13, turning it OFF. In this case, when the potential at the connection point N23 goes to the "L" level, an "H" level signal is fed to the gate electrode of the final-stage NMOS transistor Q14, turning it ON. Since the transistor Q13 is OFF, however, the turning-ON of the transistor Q14 will cause no current flow from the second powersupply potential point to the ground potential point.

As described above, Embodiment 2 makes it possible to prevent an abnormal through current in the final stage of the buffer circuit only by resetting the "H" level output of the first signal level converter circuit to the "L" level.

Next, a modified form of Embodiment 2 will be described below.

Figure 12:
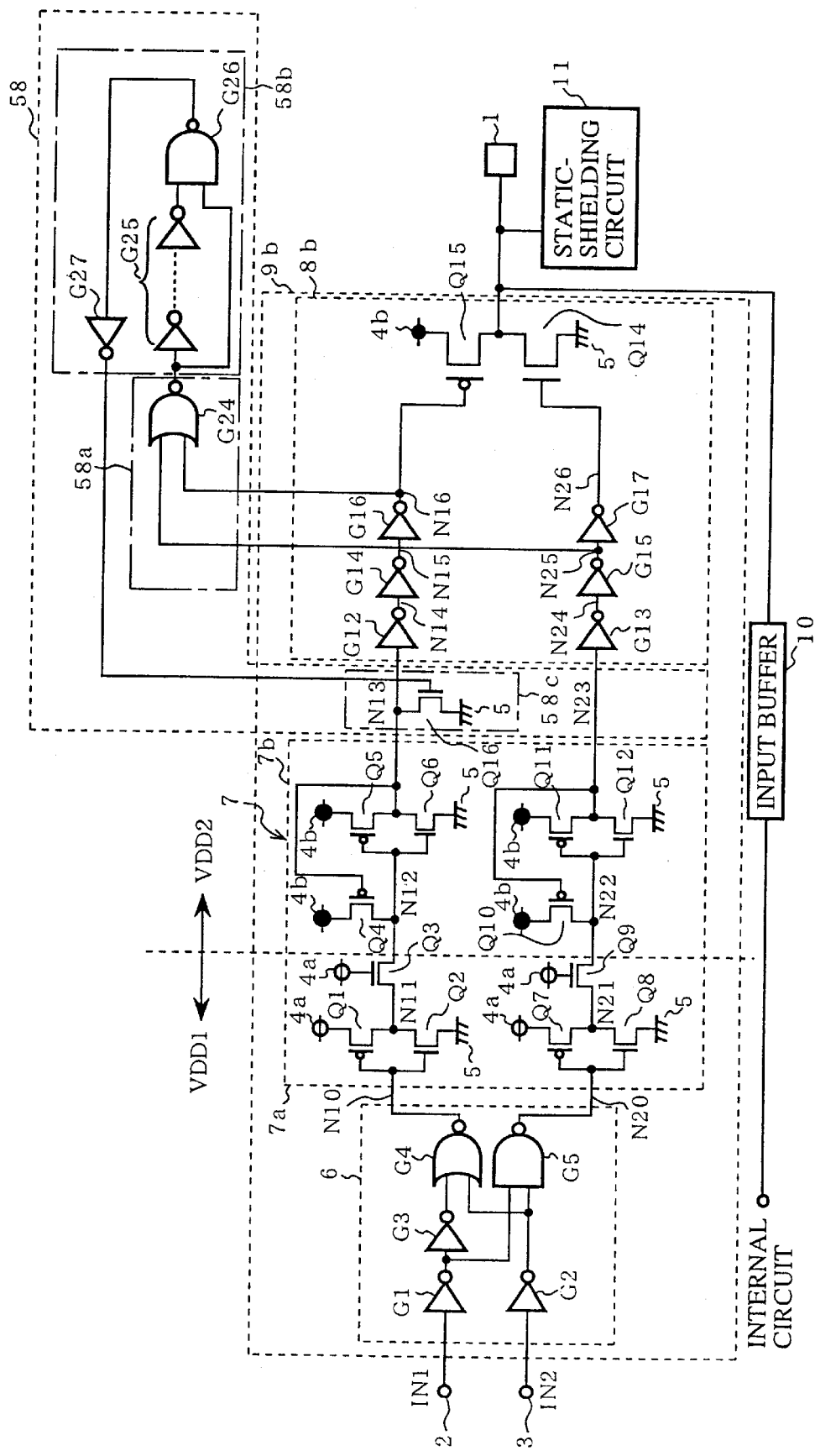
FIG. 12 is a circuit diagram illustrating the configuration of a modified form of Embodiment 2 of the present invention.

FIG. 12 is a circuit diagram of the modified form. Since this modification is identical in circuit configuration with Embodiment 2 of FIG. 6 except the buffer circuit 8b, the parts identical with those in the FIG. 6 embodiment are identified by the same reference numerals and no description will be repeated thereof.

The buffer circuit 8b differs from the buffer circuit 8a in the same points as described previously with respect to Embodiment 1.

With the circuit configuration of this modified form, too, it is possible, as is the case with Embodiment 2, to prevent the abnormal through current in the final stage of the buffer circuit simply by resetting the "H" level output of the first signal level converter circuit to the "L" level.

Embodiment 3

Figure 7:
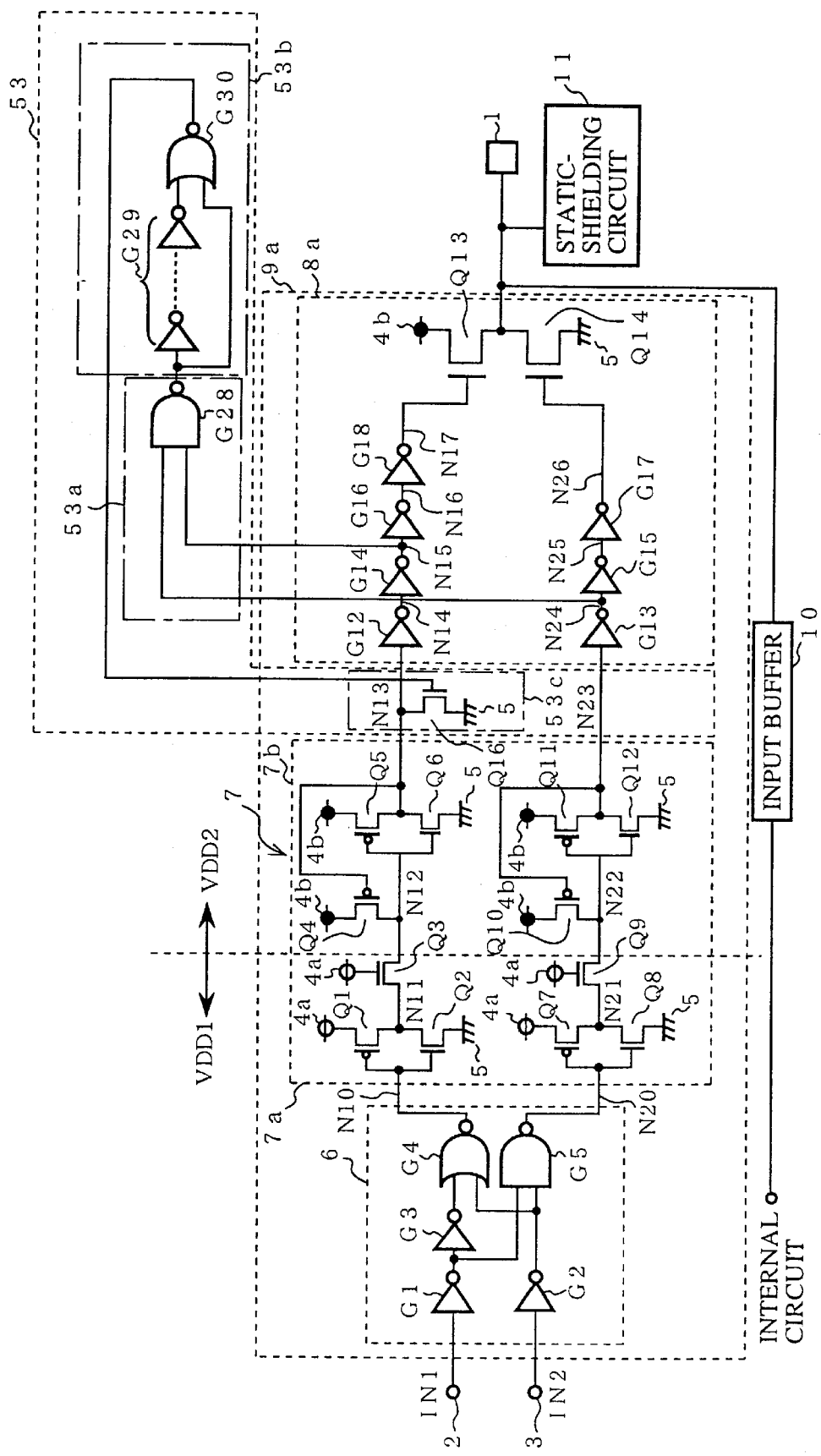
FIG. 7 is a circuit diagram illustrating the configuration of Embodiment 3 of the present invention.

FIG. 7 is a circuit diagram of an output buffer circuit according to Embodiment 3 of the present invention, depicting the configuration of an input/output circuit of a semiconductor integrated circuit device equipped with the signal level conversion facility. Since the illustrated embodiment is identical in circuit configuration with Embodiment 1 of FIG. 5 except a third reset circuit 53, the parts identical with those in the latter are identified by the same reference numerals, of which no description will be repeated.

The third reset circuit 53 in Embodiment 3 is made up of a through-current detection logic generating part 53a, a conditioning part 53b and a forced logic-application part 53c.

The through-current detection logic generating part 53a is formed by a NAND gate G28 which has its first input terminal connected to the connection point N15 and its second input terminal connected to the connection point N24.

The conditioning part 53b comprises a delay circuit G29 composed of an even number of inverter gates connected to the output terminal of the NAND gate G28, and a NAND gate G30 connected at its first input terminal to the output terminal of the NAND gate G28 and at its second input terminal to the output terminal of the delay circuit G29.

The forced logic-application part 53c is formed by an NMOS transistor Q16 which has a source electrode connected to the ground potential point 5, a gate electrode for receiving the output from the conditioning part 53b and a drain electrode connected to the connection point N13 that is the output terminal of the first level converting circuit.

The third reset circuit 53 is formed by MOS transistors, and their gate insulating films are thicker than those of the MOS transistors forming the input/output control circuit 6 and the first converter circuit block 7a.

The operation of the input/output circuit of the above circuit configuration will be described. The circuit operation will be described in connection with the normal mode of operation and the abnormal mode of operation as referred to previously.

The circuit operation under normal condition is the same as described previously in respect of Embodiment 1. In this instance, in the third reset circuit 53 operates so that the NOR gate G20 of the conditioning part 53b ultimately yields an "L" level output, and the output is applied to the gate of the NMOS transistor Q13 of the forced logic-application part 53c. As a result, the NMOS transistor Q16 turns OFF and no influence is exerted on the output operation of the buffer circuit 9a. The delay circuit G29 performs the same function as in the case of Embodiment 1.

Next, a description will be given of the operation under abnormal condition. The state that becomes an issue is the case where the final-stage NMOS transistors Q13 and Q14 both turn ON at the same time, and consequently, the case where the gate electrodes of the NMOS transistors Q13 and Q14 both go to the "H" level. The reason for this and the solution thereto are the same as described previously with reference to Embodiment 1, and hence no description will be repeated thereof.

In the case where the output from the signal level converter circuit 7 is "H" at the connection point N13 and "L" at the connection point N23, and consequently the NMOS transistors Q13 and Q14 of the final stage are both in the ON state, the NAND gate G28 receives at each of its first and second input terminals a signal fixed at the "H" level and outputs an "L" level signal, which is branched into two, the one of which is provided via the delay circuit G29 to the second input terminal of the NOR gate G30 and the other of which is provided directly to the first input terminal of the NOR gate G30; the two inputs are compared.

As a result, the NOR gate G30 of the conditioning part 53b provides an "H" level output, turning ON the NMOS transistor Q16 of the forced logic-application part 53c. In consequence, the potential at the connection point N13 goes to the "L" level equal to the ground potential and an "L" level signal is applied to the gate electrode of the final-stage NMOS transistor Q13, turning it OFF. In this case, when the potential at the connection point N23 goes to the "L" level, an "H" level signal is fed to the gate electrode of the final-stage NMOS transistor Q14, turning it ON. Since the transistor Q13 is OFF, however, the turning-ON of the transistor Q14 will cause no current flow from the second power-supply potential point to the ground potential point.

As described above, Embodiment 3 makes it possible to prevent an abnormal through current in the final stage of the buffer circuit only by resetting the "H" level output of the first signal level converter circuit to the "L" level.

Next, a modified form of Embodiment 3 will be described below.

Figure 13:
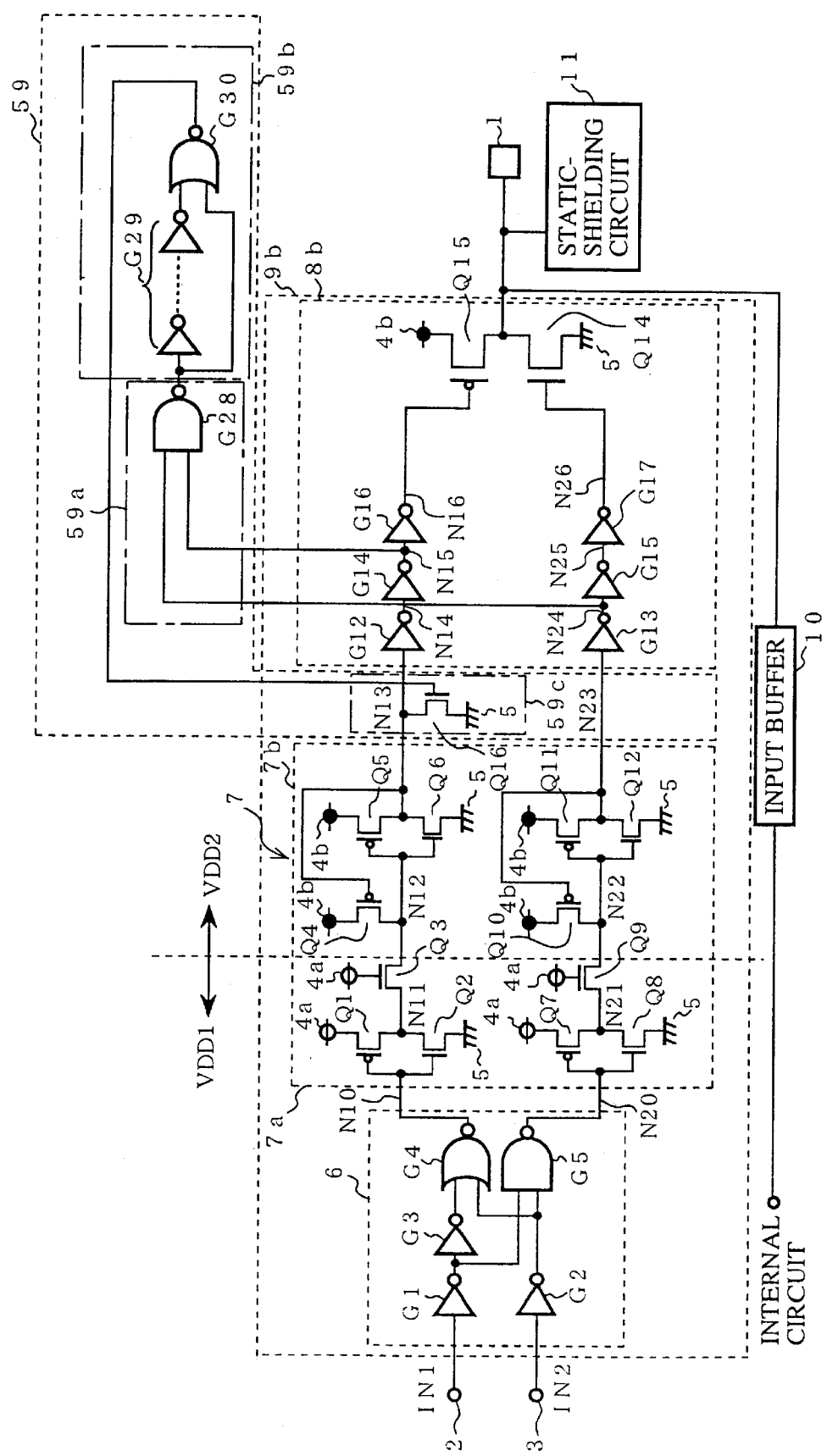
FIG. 13 is a circuit diagram illustrating the configuration of a modified form of Embodiment 3 of the present invention.

FIG. 13 is a circuit diagram of the modified form. Since this modification is identical in circuit configuration with Embodiment 3 of FIG. 7 except the buffer circuit 8b, the parts identical with those in the FIG. 7 embodiment are identified by the same reference numerals and no description will be repeated thereof.

The buffer circuit 8b differs from the buffer circuit 8a in the same points as described previously with respect to Embodiment 1.

With the circuit configuration of this modified form, too, it is possible, as is the case with Embodiment 3, to prevent the abnormal through current in the final stage of the buffer circuit simply by resetting the "H" level output of the first signal level converter circuit to the "L" level.

Embodiment 4

Figure 8:
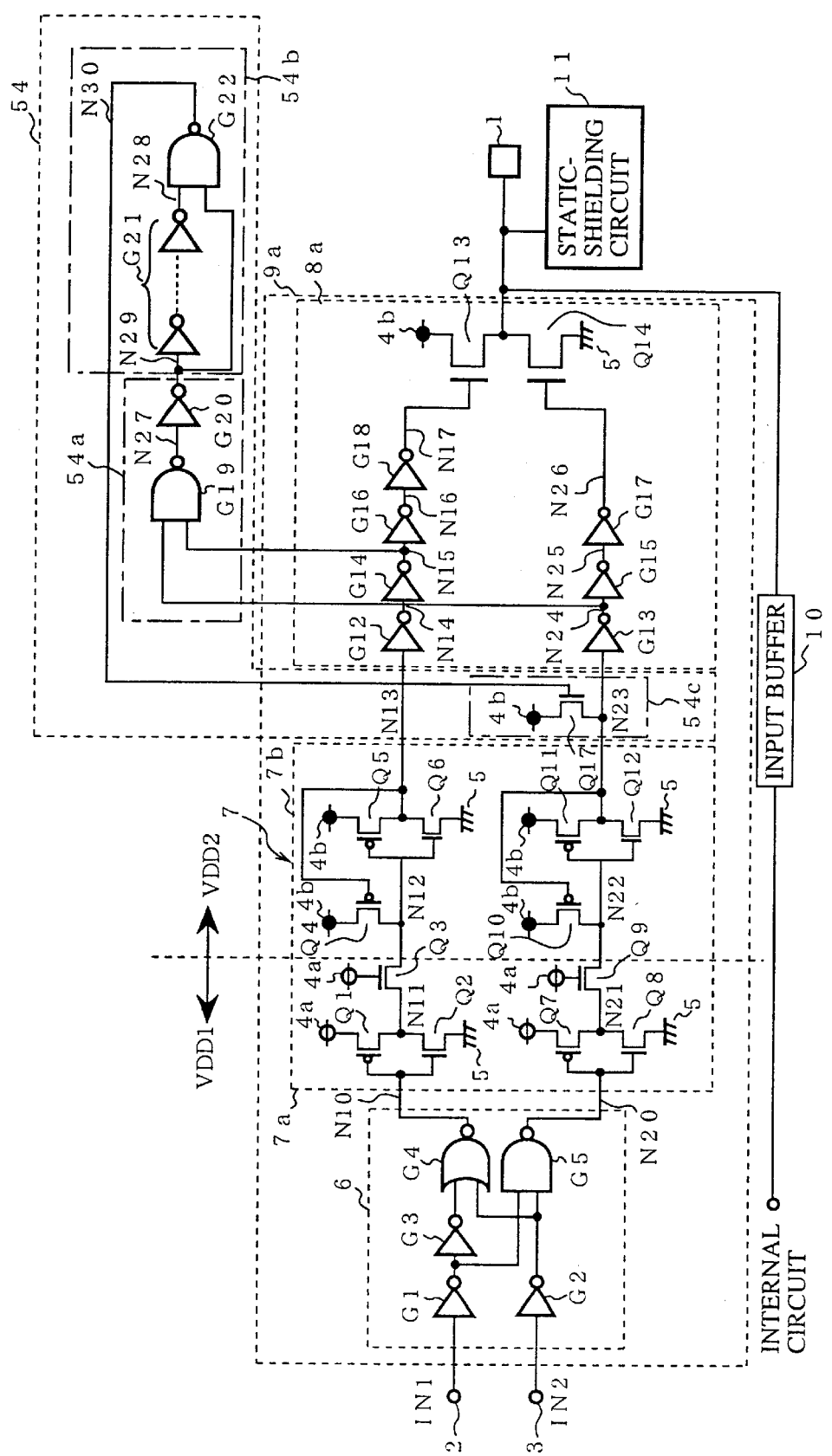
FIG. 8 is a circuit diagram illustrating the configuration of Embodiment 4 of the present invention.

FIG. 8 is a circuit diagram of an output buffer circuit according to Embodiment 4 of the present invention, depicting the configuration of an input/output circuit of a semiconductor integrated circuit device equipped with the signal level conversion facility. Since the illustrated embodiment is identical in circuit configuration with Embodiment 1 of FIG. 5 except a fourth reset circuit 54, the parts identical with those in the latter are identified by the same reference numerals, of which no description will be repeated.

The fourth reset circuit 54 in Embodiment 4 is made up of a through-current detection logic generating part 54a, a conditioning part 54b and a forced logic-application part 54c.

The through-current detection logic generating part 54a is composed of a NAND gate G19 which has its first input terminal connected to the connection point N15 and its second input terminal connected to the connection point N24, and an inverter gate G20 connected to the output terminal of the NAND gate G19.

The conditioning part 54b comprises a delay circuit G21 composed of an even number of inverter gates connected to the output terminal of the inverter gate G20, and a NAND gate G22 connected at its first input terminal to the output terminal of the inverter gate G20 and at its second input terminal to the output terminal of the delay circuit G21.

The forced logic-application part 54c is formed by a PMOS transistor Q17 which has a source electrode connected to the second power-supply potential point 4b, a gate electrode for receiving the output from the conditioning part 54b and a drain electrode connected to the connection point N23 that is the output terminal of the second level converting circuit.

The fourth reset circuit 54 is formed by MOS transistors, and their gate insulating films are thicker than those of the MOS transistors forming the input/output control circuit 6 and the first converter circuit block 7a.

The operation of the input/output circuit of the above configuration will be described. The circuit operation will be described in connection with the normal mode of operation and the abnormal mode of operation as referred to previously. The configuration and operation of the fourth reset circuit are substantially the same as described previously in respect of Embodiment 1. Accordingly, the operating waveforms in the timing charts of FIGS. 17 and 18 are the same as in the case of the reset circuit 54 except n31.

The operation of the fourth reset circuit 54 under normal condition will be described below.

In this case, the input/output circuit is in the output state with the control signal IN1 at the "L" level. When the output signal IN2 is at the "H" level and applied to the input/output control circuit 6 and the signal level converter circuit 7, the output therefrom is at the "L" level at the connection point N24 and at the "H" level at the connection point N15 as described above. Similarly, when the output signal IN2 is at the "L" level, the logical level is "H" at the connection point N24 and "L" at the connection point N15.

The circuit state in question in which to generate the reset signal is the case where the final-stage NMOS transistors Q13 and Q14 both turn ON at the same time, that is, the case where the gate electrodes of the final-stage NMOS transistors Q13 and Q14 both go to the "H" level. In this instance, in the conditioning part 54b a signal delayed by the delay circuit G21 connected to the second input terminal of the second NAND gate G22 and an unprocessed signal fed to its first input terminal are compared with each other. In this case, The delay time of the delay circuit G22 needs to be shorter than the period T of the circuit operation. As a result, the output at the connection point N30 goes to the "H" level, turning OFF the PMOS transistor Q17 and hence keeping the circuit from being reset. Accordingly, no influence is exerted on the output circuit operation.

Next, The operation of the fourth reset circuit 54 will be described using the timing chart of FIG. 18. The state that becomes an issue is the case where the gate electrodes of the final-stage NMOS transistors Q13 and Q14 both go to the "H" level as referred to previously. The reason for this and the solution thereto are the same as described previously, and hence no description will be repeated thereof.

The first NAND gate G19 receives at its first and second input terminals signals fixed at the "H" level as indicated by n 15 and n24 in FIG. 18, and its output (waveform n27) is applied to the first inverter G20. Its output (waveform n28) is branched into two, the one (waveform n29) of which is provided via the delay circuit G21 to the second input terminal of the second NAND gate G22 and the other (waveform n28) of which is provided directly to the first input terminal of the gate G22; the two inputs are compared. As the result of this, the gate G22 provides an "L" level output (waveform n30), then the PMOS transistor Q17 turns ON to make the potential at the connection point N23 go to the "H" level, and an "L" level signal is applied to the gate electrode of the final-stage NMOS transistor Q14, turning it OFF. Hence, no current flows through the final-stage transistors Q14 and Q13 from the second power-supply potential point to the ground potential point.

As described above, Embodiment 4 makes it possible to prevent an abnormal through current in the final stage of the buffer circuit only by resetting the "L" level output of the second signal level converter circuit to the "H" level.

Next, a modified form of Embodiment 4 will be described below.

Figure 14:
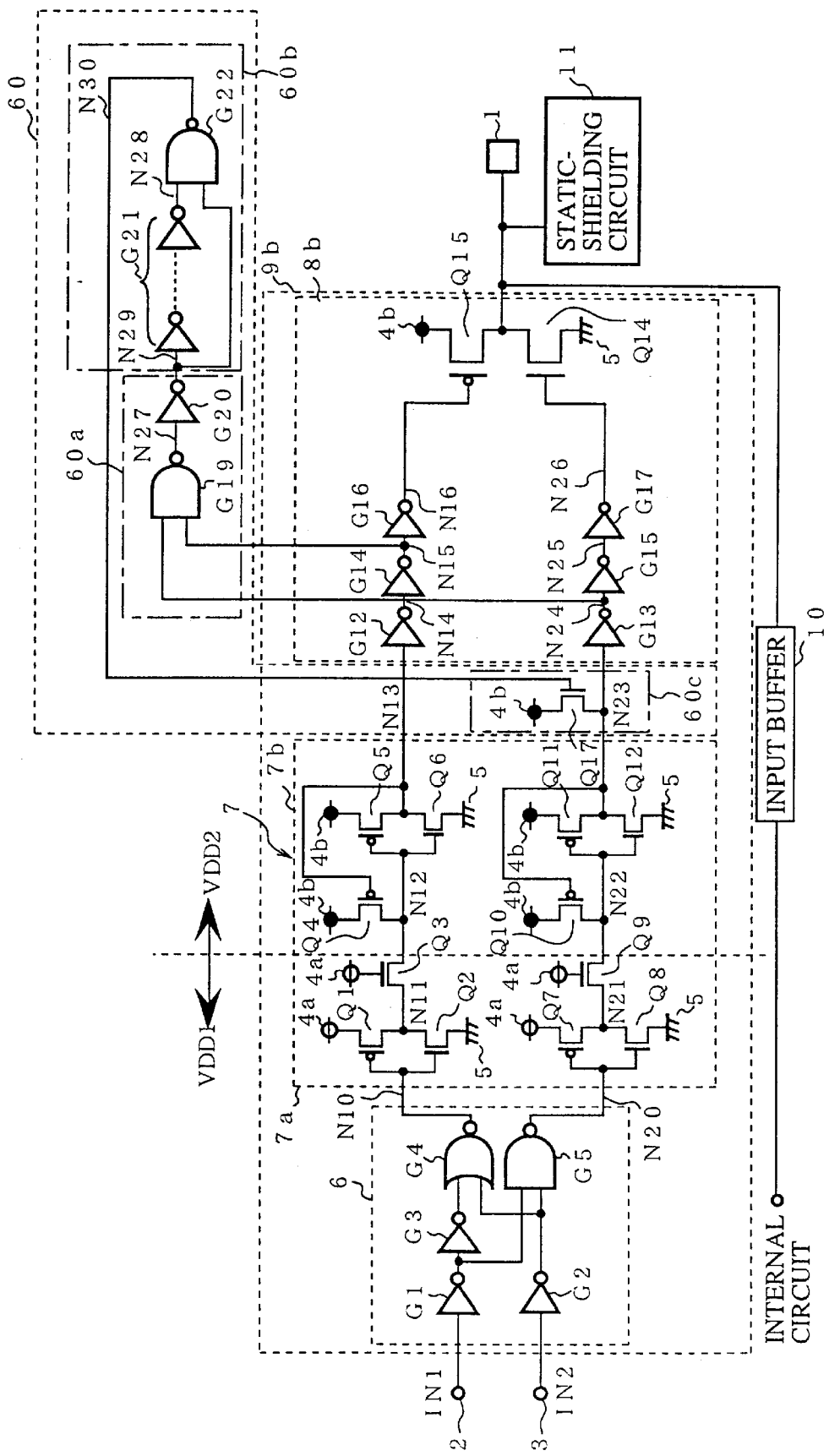
FIG. 14 is a circuit diagram illustrating the configuration of a modified form of Embodiment 4 of the present invention.

FIG. 14 is a circuit diagram of the modified form. Since this modification is identical in circuit configuration with Embodiment 4 of FIG. 8 except the buffer circuit 8b, the parts identical with those in the FIG. 8 embodiment are identified by the same reference numerals and no description will be repeated thereof.

The buffer circuit 8b differs from the buffer circuit 8a in the same points as described previously with respect to Embodiment 1.

With the circuit configuration of this modified form, too, it is possible, as is the case with Embodiment 4, to prevent the abnormal through current in the final stage of the buffer circuit simply by resetting the "L" level output of the second signal level converter circuit to the "H" level.

Embodiment 5

Figure 9:
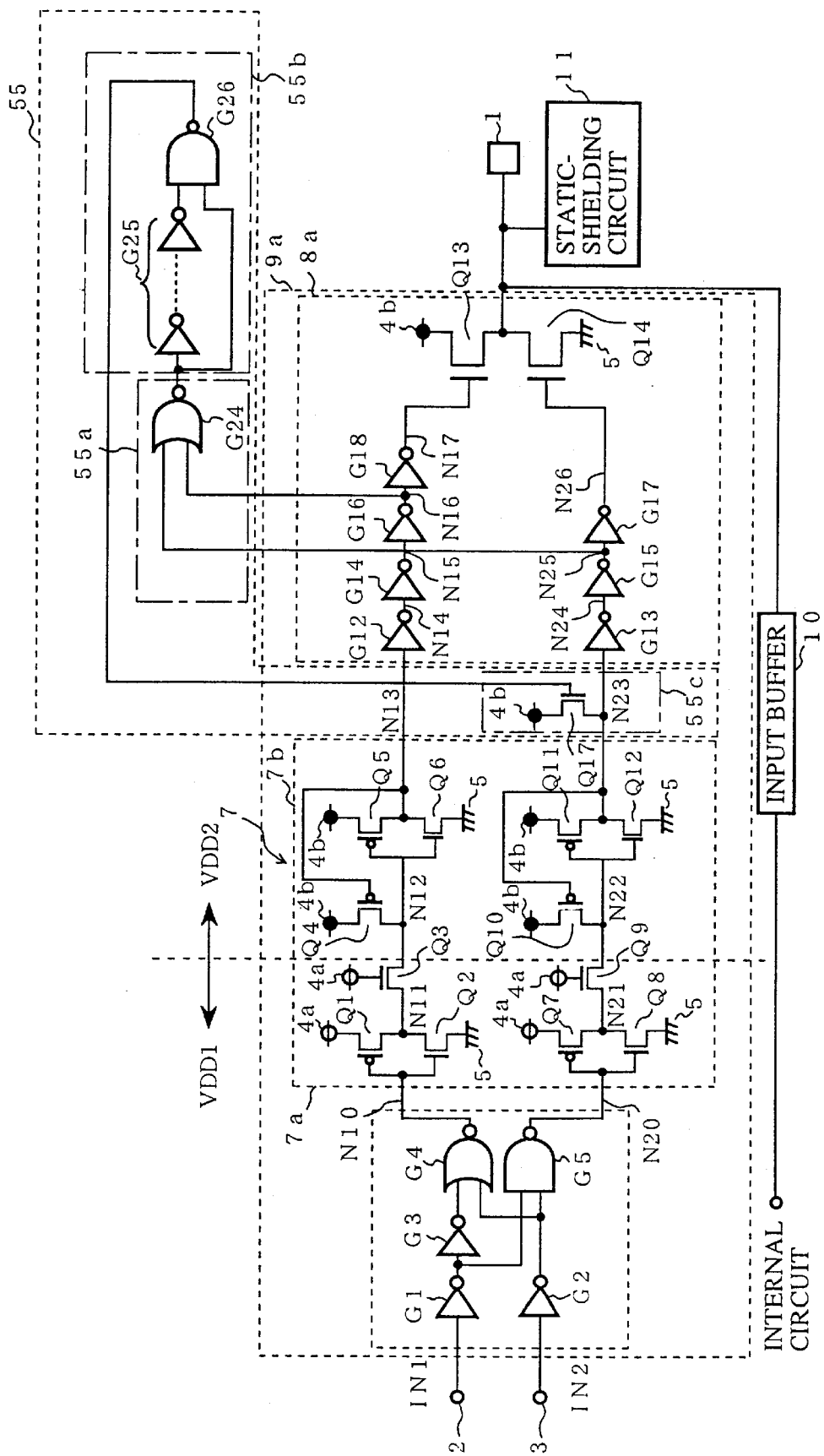
FIG. 9 is a circuit diagram illustrating the configuration of Embodiment 5 of the present invention.

FIG. 9 is a circuit diagram of an output buffer circuit according to Embodiment 5 of the present invention, depicting the configuration of an input/output circuit of a semiconductor integrated circuit device equipped with the signal level conversion facility. Since the illustrated embodiment is identical in circuit configuration with Embodiment 1 of FIG. 5 except a fifth reset circuit 55, the parts identical with those in the latter are identified by the same reference numerals, of which no description will be repeated.

The fifth reset circuit 55 in Embodiment 5 is made up of a through-current detection logic generating part 55a, a conditioning part 55b and a forced logic-application part 55c.

The through-current detection logic generating part 55a is formed by a NOR gate G24 which has its first input terminal connected to the connection point N16 and its second input terminal connected to the connection point N25.

The conditioning part 55b comprises a delay circuit G25 composed of an even number of inverter gates connected to the output terminal of the NOR gate G24, and a NAND gate G26 connected at its first input terminal to the output terminal of the NOR gate G24 and at its second input terminal to the output terminal of the delay circuit G25.

The forced logic-application part 55c is formed by a PMOS transistor Q17 which has a source electrode connected to the second power-supply potential point 4b, a gate electrode for receiving the output from the conditioning part 55b and a drain electrode connected to the connection point N23 that is the output terminal of the second level converting circuit.

The fifth reset circuit 55 is formed by MOS transistors, and their gate insulating films are thicker than those of the MOS transistors forming the input/output control circuit 6 and the first converter circuit block 7a.

The operation of the input/output circuit of the above configuration will be described. The circuit operation will be described in connection with the normal mode of operation and the abnormal mode of operation as referred to previously. The configuration and operation of this reset circuit are substantially the same as described previously in respect of Embodiment 1. Accordingly, the operating waveforms in the timing charts of FIGS. 17 and 18 are the same as in the case of the reset circuit 55 except n31.

A description will be given first of the operation under normal condition in which the first power-supply potential VDD1 and the second power-supply potential VDD2 are both normally switched on. The circuit operation in this case is the same as in the case of Embodiment 2. The fifth reset circuit 55 operates so that the NAND gate G26 outputs an "H" level signal, which is fed to the gate electrode of the PMOS transistor Q17 of the forced logic-application part 55c. As the result of this, the PMOS transistor Q17 turns OFF, exerting no influence on the output operation.

Next, the circuit operation during the abnormal power supply operation will be described. The state that becomes an issue is the case where the final-stage NMOS transistors Q13 and Q14 both turn ON at the same time, that is, the case where a current flows through the final-stage NMOS transistors Q13 and Q14 from the second power-supply potential point to the ground potential point. The reason for this is such as described previously; this problem can be solved by detecting such a state in the buffer circuit 8a (at the connection points N16 and N25) and feeding back the detected output to the level converter circuit 7 of the preceding stage via the fifth reset circuit 55. This will be described below in more detail. In the state in which the final-stage NMOS transistors Q13 and Q14 both turn ON, the NOR gate G24 of the through-current detection logic generating part 55b receives at its first and second input terminals signals fixed at the "L" level, and yields an "H" level output; this output is branched into two, the one of which is provided via the delay circuit G25 to the second input terminal of the NAND gate G26 and the other of which is provided directly to the first input terminal of the gate G26. The two inputs are compared, and as the result of this, the NAND gate G26 provides an "L" level output, turning ON the PMOS transistor Q17. The turning-ON of the PMOS transistor Q17 makes the potential at the connection point N23 go to the "H" level, and an "L" level signal is applied to the gate electrode of the final-stage NMOS transistor Q14, turning it OFF. Hence, no current flows through the final-stage transistors Q13 and Q14 from the second power-supply potential point to the ground potential point.

As described above, Embodiment 5 makes it possible to prevent an abnormal through current in the final stage of the buffer circuit only by resetting the "L" level output of the second signal level converter circuit to the "H" level.

Next, a modified form of Embodiment 5 will be described below.

Figure 15:
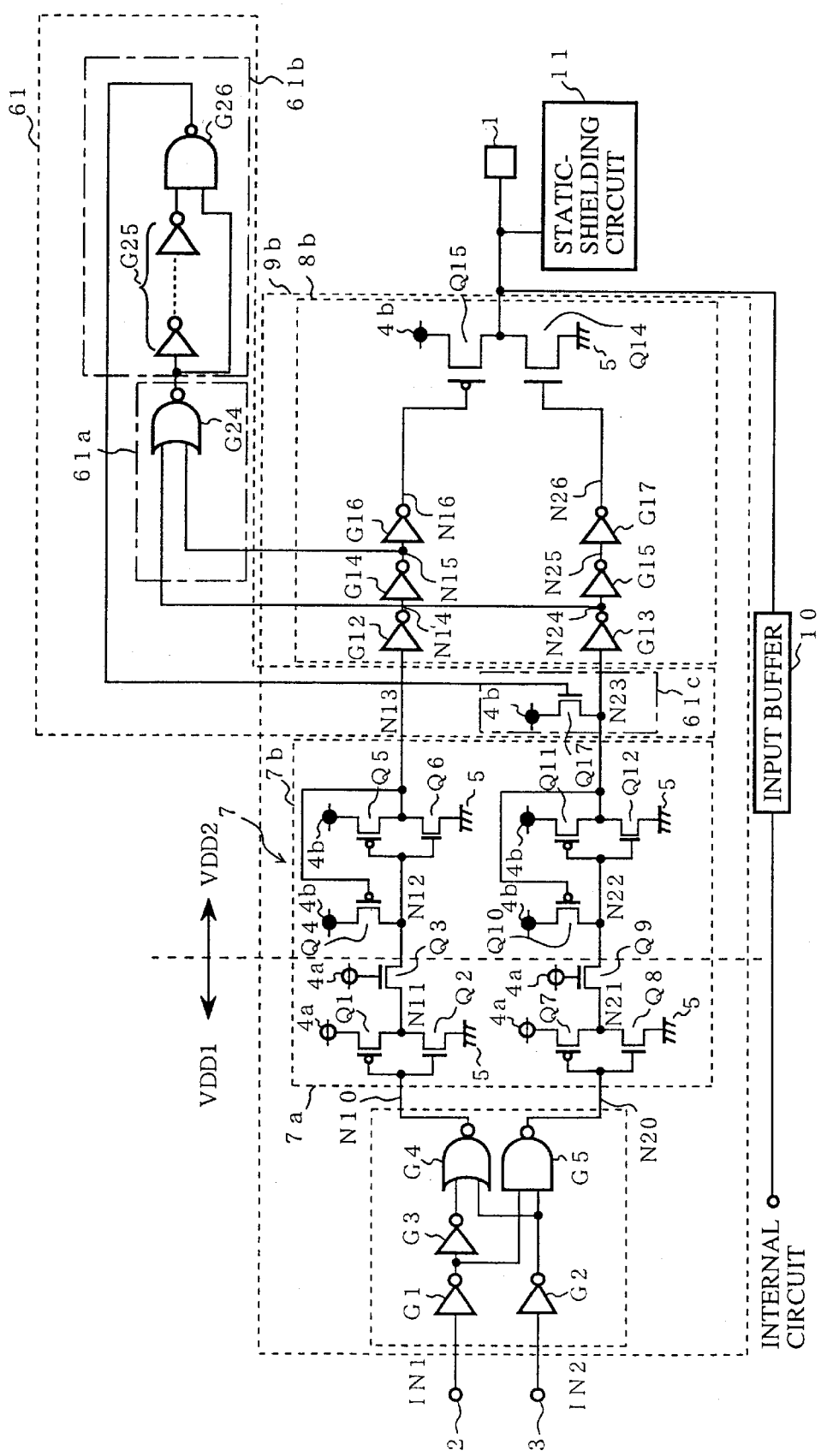
FIG. 15 is a circuit diagram illustrating the configuration of a modified form of Embodiment 5 of the present invention.

FIG. 15 is a circuit diagram of the modified form. Since this modification is identical in circuit configuration with Embodiment 5 of FIG. 9 except the buffer circuit 8b, the parts identical with those in the FIG. 9 embodiment are identified by the same reference numerals and no description will be repeated thereof.

The buffer circuit 8b differs from the buffer circuit 8a in the same points as described previously with respect to Embodiment 1.

With the circuit configuration of this modified form, too, it is possible, as is the case with Embodiment 5, to prevent the abnormal through current in the final stage of the buffer circuit simply by resetting the "L" level output of the second signal level converter circuit to the "H" level.

Embodiment 6

Figure 10:
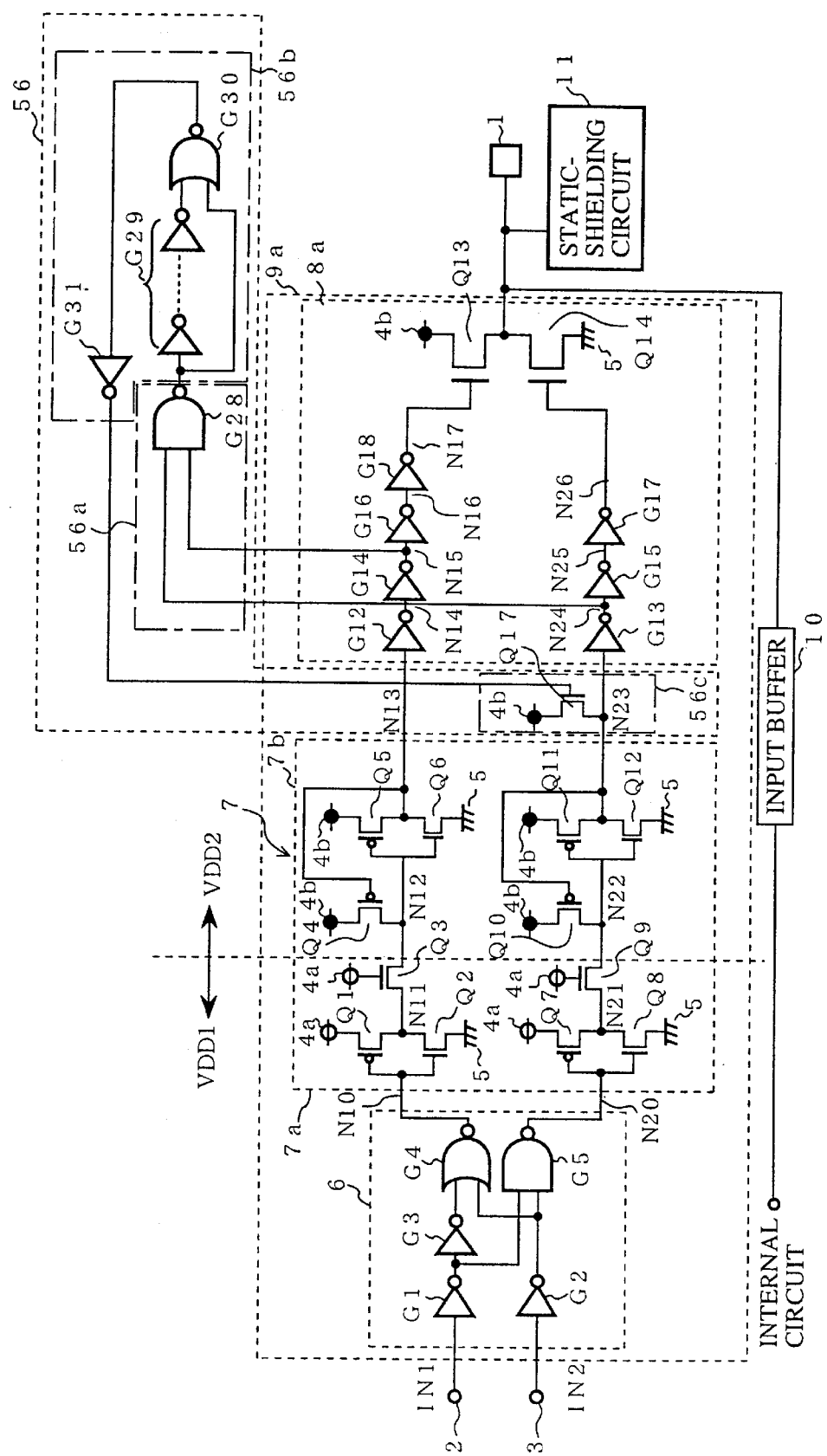
FIG. 10 is a circuit diagram illustrating the configuration of Embodiment 6 of the present invention.

FIG. 10 is a circuit diagram of an output buffer circuit according to Embodiment 6 of the present invention, depicting the configuration of an input/output circuit of a semiconductor integrated circuit device equipped with the signal level conversion facility. Since the illustrated embodiment is identical in circuit configuration with Embodiment 1 of FIG. 5 except a sixth reset circuit 56, the parts identical with those in the latter are identified by the same reference numerals, of which no description will be repeated.

The sixth reset circuit 56 in Embodiment 6 is made up of a through-current detection logic generating part 56a, a conditioning part 56b and a forced logic-application part 56c.

The through-current detection logic generating part 56a is formed by a NAND gate G28 which has its first input terminal connected to the connection point N15 and its second input terminal connected to the connection point N24.

The conditioning part 56b comprises a delay circuit G29 composed of an even number of inverter gates connected to the output terminal of the NAND gate G28, a NOR gate G30 having its first input terminal connected to the output terminal of the NAND gate G28 and its second input terminal connected to the output terminal of the delay circuit G29, and an inverter gate G31 connected to the output terminal of the NOR gate G30.

The forced logic-application part 56c is formed by a PMOS transistor Q17 which has a source electrode connected to the second power-supply potential point 4b, a gate electrode for receiving the output from the conditioning part 56b via the inverter gate G31 and a drain electrode connected to the connection point N23 that is the output terminal of the second level converting circuit.

The sixth reset circuit 56 is formed by MOS transistors, and their gate insulating films are thicker than those of the MOS transistors forming the input/output control circuit 6 and the first converter circuit block 7a.

The operation of the circuit of the above configuration will be described. The circuit operation will be described in connection with the normal mode of operation and the abnormal mode of operation as referred to previously. The configuration and operation of this reset circuit are substantially the same as described previously in respect of Embodiment 1. Accordingly, the operating waveforms in the timing charts of FIGS. 17 and 18 are the same as in the case of the reset circuit 56 except n31.

A description will be given first of the operation under normal condition in which the first power-supply potential VDD1 and the second power-supply potential VDD2 are both normally switched on. The circuit operation in this case is the same as in the case of Embodiment 3. The sixth reset circuit 56 operates so that the NOR gate G30 outputs an "L" level signal, which is fed to the inverter gate G31. The output from the inverter gate G31 goes to the "H" level, which is applied to the gate electrode of the PMOS transistor Q17 of the next stage. As the result of this, the PMOS transistor Q17 turns OFF, exerting no influence on the output operation. The delay circuit G29 performs the same function as in the case of Embodiment 1.

Next, the circuit operation during the abnormal power supply operation will be described. The state that becomes an issue is the case where the final-stage NMOS transistors Q13 and Q14 both turn ON at the same time, that is, the case where a current flows from the second power-supply potential point to the ground potential point. The reason for this is such as described previously; this problem can be solved by detecting such a state in the buffer circuit 8a (at the connection points N15 and N24) and feeding back the detected output to the level converter circuit 7 of the preceding stage via the sixth reset circuit 56.

This will be described below in more detail. In the state in which the final-stage NMOS transistors Q13 and Q14 are both in the ON state, the NAND gate G28 of the through-current detection logic generating part 55b receives at its first and second input terminals signals fixed at the "H" level, and yields an "L" level output; this output is branched into two, the one of which is provided via the delay circuit G29 to the second input terminal of the NOR gate G30 and the other of which is provided directly to the first input terminal of the NOR gate G30. The two inputs are compared and computed, and as the result of this, the NOR gate G30 provides an "H" level output, which is provided to the inverter gate G31, from which an "L" level signal is fed to the gate electrode of the PMOS transistor Q17. Consequently, the PMOS transistor Q17 turns ON. The turning-ON of the PMOS transistor Q17 makes the potential at the connection point N23 go to the "H" level, and an "L" level signal is applied to the gate electrode of the final-stage NMOS transistor Q14, turning it OFF. Hence, no current flows through the final-stage transistors Q13 and Q14 from the second power-supply potential point to the ground potential point.

As described above, Embodiment 6 makes it possible to prevent an abnormal through current in the final stage of the buffer circuit only by resetting the "L" level output of the second signal level converter circuit to the "H" level.

Next, a modified form of Embodiment 6 will be described below.

Figure 16:
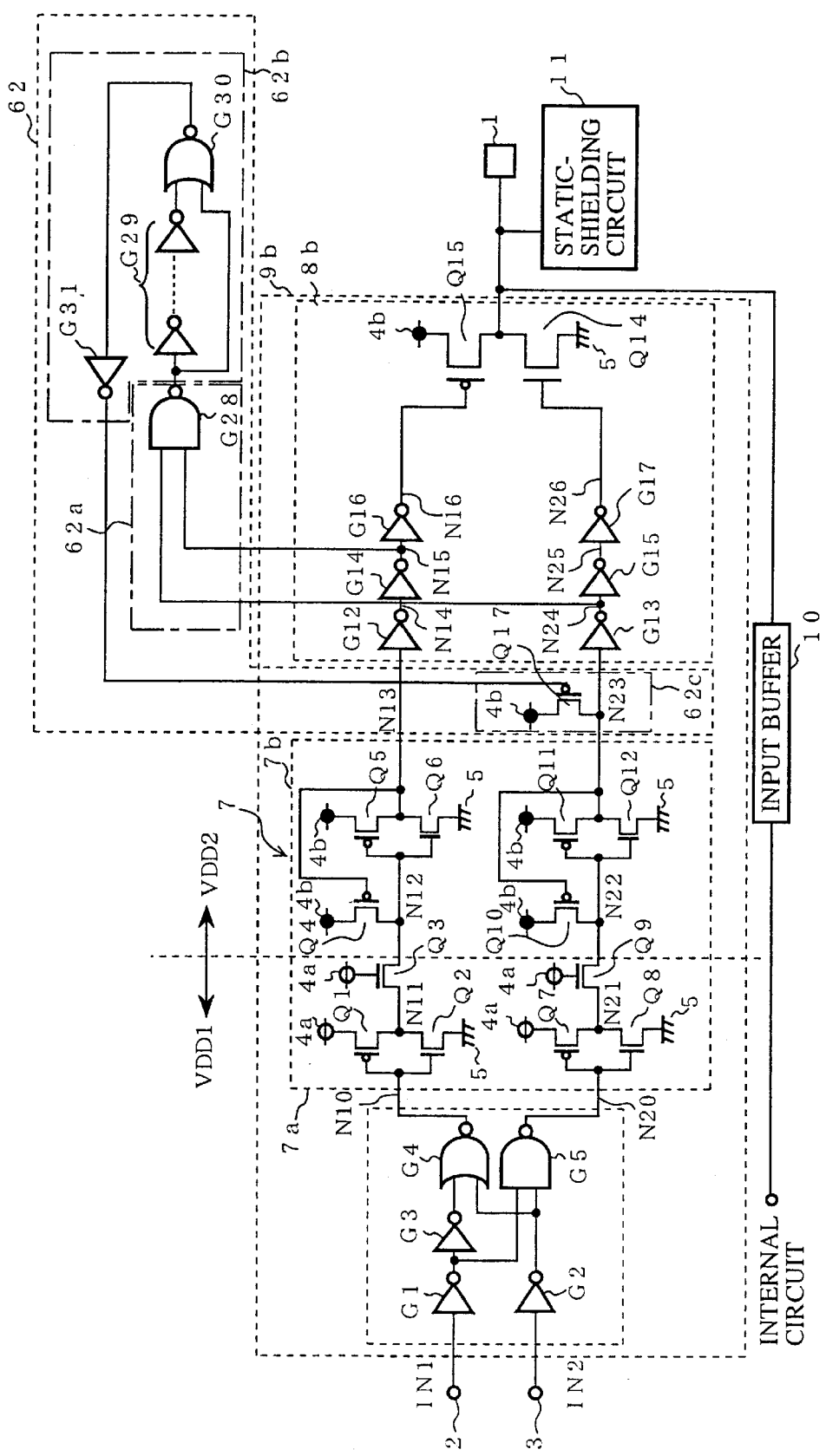
FIG. 16 is a circuit diagram illustrating the configuration of a modified form of Embodiment 6 of the present invention.

FIG. 16 is a circuit diagram of the modified form. Since this modification is identical in circuit configuration with Embodiment 6 of FIG. 10 except the buffer circuit 8b, the parts identical with those in the FIG. 9 embodiment are identified by the same reference numerals and no description will be repeated thereof.

The buffer circuit 8b differs from the buffer circuit 8a in the same points as described previously with respect to Embodiment 1.

With the circuit configuration of this modified form, too, it is possible, as is the case with Embodiment 1, to prevent the abnormal through current in the final stage of the buffer circuit simply by resetting the "L" level output of the second signal level converter circuit to the "H" level.

What is claimed is:

1. An output buffer circuit comprising:

first and second potential points which receive first and second potentials, respectively;

an output point;

a first conduction control element which has a control terminal for receiving a third potential corresponding to either one of binary logical values consisting of first logic and second logic complementary to the first logic and which permits and inhibits conduction between said first potential point and said output point when the third potential corresponds to the first logic and the second logic, respectively;

a second conduction control element which has a control terminal for receiving a fourth potential corresponding to either one of binary logical values consisting of third logic and fourth logic complementary to the third logic and which permits and inhibits conduction between said second potential point and said output point when the fourth potential corresponds to the third logic and the fourth logic, respectively, wherein the first logic and the third logic are complementary to each other;

through-current detection logic generating means for generating a through-current detection signal which starts when the third potential and the fourth potential correspond to the first logic and the third logic, respectively; and forced logic-application means which responds to the through-current detection signal to perform either one of a first logic applying function of forcedly applying the second logic to said control terminal of said first conduction control element and a second logic applying function of forcedly applying the fourth logic to said control terminal of said second conduction control element, said forced logic-application means including switching means which has a first terminal for connection to said control terminal of said first conduction control element and a second terminal for providing a fifth potential corresponding to the second logic, and which conducts in response to starting of the through-current detection signal.

2. An output buffer circuit comprising:

first and second potential points which receive first and second potentials, respectively;

an output point;

a first conduction control element which has a control terminal for receiving a third potential corresponding to either one of binary logical values consisting of first logic and second logic complementary to the first logic and which permits and inhibits conduction between said first potential point and said output point when the third potential corresponds to the first logic and the second logic, respectively;

a second conduction control element which has a control terminal for receiving a fourth potential corresponding to either one of binary logical values consisting of third logic and fourth logic complementary to the third logic and which permits and inhibits conduction between said second potential point and said output point when the fourth potential corresponds to the third logic and the fourth logic, respectively, wherein the first logic and the third logic are complementary to each other;

through-current detection logic generating means for generating a through-current detection signal which starts when the third potential and the fourth potential correspond to the first logic and the third logic, respectively; and forced logic-application means which responds to the through-current detection signal to perform either one of a first logic applying function of forcedly applying the second logic to said control terminal of said first conduction control element and a second logic applying function of forcedly applying the fourth logic to said control terminal of said second conduction control element, said forced logic-application means including switching means which has a first terminal for connection to said control terminal of said second conduction control element and a second terminal for providing a fifth potential corresponding to the fourth logic, and which conducts in response to starting of the through-current detection signal.

3. An output buffer circuit comprising:

first and second potential points which receive first and second potentials, respectively;

an output point;

a first conduction control element which has a control terminal for receiving a third potential corresponding to either one of binary logical values consisting of first logic and second logic complementary to the first logic and which permits and inhibits conduction between said first potential point and said output point when the third potential corresponds to the first logic and the second logic, respectively, wherein the first logic and the third logic are complementary to each other, and said first conduction control element comprising a first MOS transistor of a first conductivity type which has a gate and a set of electrodes connected to said first potential point and said output point, respectively, and a first number of inverter gates connected in series between said control terminal of said first conduction control element and said gate of said first MOS transistor;

a second conduction control element which has a control terminal for receiving a fourth potential corresponding to either one of binary logical values consisting of third logic and fourth logic complementary to the third logic and which permits and inhibits conduction between said second potential point and said output point when the fourth potential corresponds to the third logic and the fourth logic, respectively, wherein the first logic and the third logic are complementary to each other, said second conduction control element comprising a second MOS transistor of the first conductivity type which has a gate and a set of electrodes connected to said second potential point and said output point, respectively, and a second number of inverter gates connected in series between said control terminal of said second conduction control element and said gate of said second MOS transistor, the second number having an odd-number difference from the first number.

4. The output buffer circuit according to claim 3, wherein:

said through-current detection logic generating part comprises a logic gate which outputs, as the through-current detection signal, an AND of the same logic as that corresponding to the third potential with logic complementary to that corresponding to the fourth potential; and said forced logic-application means performs the first logic applying function when receiving the same logic as that corresponding to the through-current detection signal.

5. The output buffer circuit according to claim 3, wherein:

said through-current detection logic generating part comprises a logic gate which outputs a NOT of an AND of logic complementary to that corresponding to the third potential with the same logic as that corresponding to the fourth potential; and said forced logic-application means performs the first logic applying function when receiving the same logic as that corresponding to the through-current detection signal.

6. An output buffer circuit comprising:

first and second potential points which receive first and second potentials, respectively;

an output point;

a first conduction control element which has a control terminal for receiving a third potential corresponding to either one of binary logical values consisting of first logic and second logic complementary to the first logic and which permits and inhibits conduction between said first potential point and said output point when the third potential corresponds to the first logic and the second logic, respectively, wherein the first logic and the third logic are complementary to each other, and said first conduction control element comprising a first MOS transistor of a first conductivity type which has a gate and a set of electrodes connected to said first potential point and said output point, respectively, and a first number of inverter gates connected in series between said control terminal of said first conduction control element and said gate of said first MOS transistor;

a second conduction control element which has a control terminal for receiving a fourth potential corresponding to either one of binary logical values consisting of third logic and fourth logic complementary to the third logic and which permits and inhibits conduction between said second potential point and said output point when the fourth potential corresponds to the third logic and the fourth logic, respectively, wherein the first logic and the third logic are complementary to each other, said second conduction control element comprising a second MOS transistor of a second conductivity type, complementary to the first conductivity type, which has a gate and a set of electrodes connected to said second potential point and said output point, respectively, and a second number of inverter gates connected in series between said control end of said second conduction control element and said gate of said second MOS transistor, the second number having an even-number difference from the first number;

through-current detection logic generating means for generating a through-current detection signal which starts when the third potential and the fourth potential correspond to the first logic and the third logic, respectively; and forced logic-application means which responds to the through-current detection signal to perform either one of a first logic applying function of forcedly applying the second logic to said control terminal of said first conduction control element and a second logic applying function of forcedly applying the fourth logic to said control terminal of said second conduction control element.

7. The output buffer circuit according to claim 6, wherein:

said through-current detection logic generating part comprises a logic gate which outputs, as the through-current detection signal, an AND of the same logic as that corresponding to the third potential with logic complementary to that corresponding to the fourth potential; and said forced logic-application means performs the first logic applying function when receiving the same logic as that corresponding to the through-current detection signal.

8. The output buffer circuit according to claim 6, wherein said through-current detection logic generating part comprises a logic gate which outputs the NOT of the AND of logic complementary to that corresponding to said third potential with the same logic as that corresponding to said fourth potential; and said forced logic-application means performs said first logic applying function when receiving the same logic as that corresponding to said through-current detection signal.

9. The output buffer circuit according to claim 6, wherein said through-current detection logic generating part comprises a logic gate which outputs, as said through-current detection signal, the NOT of the AND of the same logic as that corresponding to said third potential with logic complementary to that corresponding to said fourth potential; and said forced logic-application means performs said first logic applying function when receiving logic complementary to that corresponding to said through-current detection signal.

10. The output buffer circuit according to claim 6, wherein said through-current detection logic generating part comprises a logic gate which outputs, as said through-current detection signal, the AND of the same logic as that corresponding to said third potential with logic complementary to that corresponding to said fourth potential; and said forced logic-application means performs said second logic applying function when receiving logic complementary to that corresponding to said through-current detection signal.

11. The output buffer circuit according to claim 6, wherein said through-current detection logic generating part comprises a logic gate which outputs the NOT of the AND of logic complementary to that corresponding to said third potential with the same logic as that corresponding to said fourth potential; and said forced logic-application means performs said second logic applying function when receiving logic complementary to that corresponding to said through-current detection signal.

12. The output buffer circuit according to claim 6, wherein:

said through-current detection logic generating part comprises a logic gate which outputs, as the through-current detection signal, a NOT of an AND of the same logic as that corresponding to the third potential with logic complementary to that corresponding to the fourth potential; and forced logic-application means performs the second logic applying function when receiving the same logic as that corresponding to the through-current detection signal.

13. An output buffer circuit comprising:

first and second potential points which receive first and second potentials, respectively;

an output point;

a first conduction control element which has a control terminal for receiving a third potential corresponding to either one of binary logical values consisting of first logic and second logic complementary to the first logic and which permits and inhibits conduction between said first potential point and said output point when the third potential corresponds to the first logic and the second logic, respectively;

a second conduction control element which has a control terminal for receiving a fourth potential corresponding to either one of binary logical values consisting of third logic and fourth logic complementary to the third logic and which permits and inhibits conduction between said second potential point and said output point when the fourth potential corresponds to the third logic and the fourth logic, respectively;

through-current detection logic generating means for generating a through-current detection signal which starts when the third potential and the fourth potential correspond to the first logic and the third logic, respectively;

forced logic-application means which responds to the through-current detection signal to perform either one of a first logic applying function of forcedly applying the second logic to said control terminal of said first conduction control element and a second logic applying function of forcedly applying the fourth logic to said control terminal of said second conduction control element; and a first power-source level system including a signal level converter circuit which provides the third and fourth potentials based on at least a first signal of binary logic, wherein the first to fourth potentials each correspond to either one of binary logical values in a second power-supply level system different from said first power-supply level system.

14. The output buffer circuit according to claim 13, wherein:

said first power-supply level system includes an output control part which outputs a first signal in response to a second signal of a pair of signals of the binary logic; and a pair of the third and fourth potentials correspond to one of a pair of first and fourth logic, a pair of second and third logic, and a pair of second and fourth logic.

15. The output buffer circuit according to claim 13, wherein:

said signal level converter circuit comprises a first half part including a plurality of MOS transistors, for performing logical processing of the first signal, and a second half part including a plurality of MOS transistors, for providing the third and fourth potentials;

said second power-supply level system has a potential difference greater than in said first power-supply level system; and said plurality of MOS transistors of said second half part have gate insulating films thicker than those of said MOS transistors of said first half part.

16. An output buffer circuit comprising:

first and second potential points which receive first and second potentials, respectively;

an output point;

a first conduction control element which has a control terminal for receiving a third potential corresponding to either one of binary logical values consisting of first logic and second logic complementary to the first logic and which permits and inhibits conduction between said first potential point and said output point when the third potential corresponds to the first logic and the second logic, respectively;

a second conduction control element which has a control terminal for receiving a fourth potential corresponding to either one of binary logical values consisting of third logic and fourth logic complementary to the third logic and which permits and inhibits conduction between said second potential point and said output point when the fourth potential corresponds to the third logic and the fourth logic, respectively;

through-current detection logic generating means for generating a through-current detection signal which starts when the third potential and the fourth potential correspond to the first logic and the third logic, respectively;

forced logic-application means which responds to the through-current detection signal to perform either one of a first logic applying function of forcedly applying the second logic to said control terminal of said first conduction control element and a second logic applying function of forcedly applying the fourth logic to said control terminal of said second conduction control element; and conditioning means which performs the function of said forced logic-application means only when a staring time of a detector circuit in said through-current detection logic generating means is longer than a specified time, said conditioning comprising a delay element which delays the through-current detection signal by the specified time and outputs a delayed detection signal; and a logic gate which starts when the logic corresponding to the through-current detection signal and the logic corresponding to the delayed detection signal are both in a special logic state.

17. The output buffer circuit according to claim 16, wherein said delay element consists of an even number of inverter gates.

* * * * *